(12) United States Patent  (10) Patent No.: US 8,525,587 B2
Hsieh  (45) Date of Patent: Sep. 3, 2013

(54) SWITCHING AMPLIFIER WITH INDUCTANCE MEANS FOR TRANSMITTING ENERGY

(76) Inventor: Wen-Hsiung Hsieh, Keelung (TW)

( * ) Notice: Subject to any disclaimer, the term of this patent is extended or adjusted under 35 U.S.C. 154(b) by 60 days.

(21) Appl. No.: 13/310,772

(22) Filed: Dec. 4, 2011

(65) Prior Publication Data

US 2013/0141162 A1  Jun. 6, 2013

(51) Int. Cl.
*H03F 3/38* (2006.01)

(52) U.S. Cl.
USPC .......................................... 330/10; 330/251

(58) Field of Classification Search
USPC .................. 330/10, 251, 207 A; 375/238
See application file for complete search history.

(56) References Cited

U.S. PATENT DOCUMENTS

| | | | |
|---|---|---|---|
| 3,629,616 A | 12/1971 | Walker | |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | Mccorkle | |
| 5,781,067 A | 7/1998 | Tota | |
| 5,805,020 A | 9/1998 | Danz | |
| 5,949,282 A | 9/1999 | Nguyen | |
| 5,986,498 A | 11/1999 | Rodriguez | |
| 6,356,151 B1 | 3/2002 | Nalbant | |
| 6,392,476 B1 | 5/2002 | Rodriguez | |
| 6,489,839 B2 | 12/2002 | Maaskant | |
| 6,563,377 B2 | 5/2003 | Butler | |
| 6,794,932 B1 | 9/2004 | Butler | |
| 6,844,777 B2 | 1/2005 | Kitamura | |
| 6,922,101 B2 | 7/2005 | Bayko | |
| 7,030,694 B2 | 4/2006 | Jonkman | |
| 7,286,008 B2 | 10/2007 | Watts | |
| 7,307,474 B2 | 12/2007 | Nguyen | |
| 7,400,191 B2 | 7/2008 | Rodriguez | |
| 7,633,336 B2 | 12/2009 | Bean | |
| 7,705,672 B1 | 4/2010 | Rodriguez | |
| 7,816,985 B2 | 10/2010 | Attwood | |
| 7,952,426 B2 | 5/2011 | Mun | |
| 7,961,047 B2 | 6/2011 | Pillonnet | |
| 7,969,126 B2 | 6/2011 | Stanley | |
| 2002/0125941 A1* | 9/2002 | Nguyen | 330/10 |

* cited by examiner

*Primary Examiner* — Robert Pascal
*Assistant Examiner* — Khiem Nguyen

(57) ABSTRACT

A switching amplifying method or a switching amplifier for obtaining one or more linearly amplified replicas of an input signal, is highly efficient, and does not have the disadvantage of "dead time" problem related to the class D amplifiers. Said switching amplifier comprises: an inductance means; a switching unit for switching a current from a DC voltage to the inductance means; a switching power transmitting unit for blocking a current when the switching unit switches on, and conducting the current from the inductance means to a filter unit positively or negatively according to the polarity of the input signal when the current from the DC voltage to the inductance means is switched off; an amplifier control unit to control the switching unit and the switching power transmitting unit according to the input signal; said filter unit filtering the current from the switching power transmitting unit to get an output signal.

20 Claims, 9 Drawing Sheets

SWITCHING AMPLIFIER WITH INDUCTANCE MEANS FOR TRANSMITTING ENERGY

BACKGROUND OF THE INVENTION (1) Field of the Invention

This invention is related in general to a power amplifier, and more particularly, to a switching amplifier that can efficiently and linearly amplify an input signal having first and second polarities for obtaining one or more than one low-distortion output signals.

(2) Description of the Related Art

Amplifiers are electronic devices which are used for increasing the power of a signal, and are generally categorized into various classes. The popular amplifiers include class A, class B and class D amplifiers. Reference is made to the exemplary U.S. patents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces one or more than one linearly amplified replicas of an input signal, is highly efficient, and does not have the "dead time" problem related to class D amplifiers.

One aspect of the present invention provides a first method of obtaining an output signal from a direct current (DC) voltage, wherein the output signal is linearly amplified replica of an input signal, comprising the steps of: receiving the input signal; transforming and pulse modulating the input signal for generating a pulse modulated signal, wherein said transforming is based on that when applying the direct current (DC) voltage across an inductance means, the energy stored in the inductance means is proportional to square of time of said applying; switching a current from the direct current (DC) voltage to the inductance means according to the pulse modulated signal; blocking a current from the inductance means to a filter when the current from the direct current (DC) voltage to the inductance means is switched on and conducting the current from the inductance means to the filter positively or negatively according to the polarity of the input signal when the current from the direct current (DC) voltage to the inductance means is switched off; filtering said current from the inductance means for outputting the output signal by the filter. Wherein the inductance means is an inductor or a flyback transformer comprising a primary winding and a secondary winding unit which is a secondary winding or two secondary windings.

Another aspect of the present invention, wherein the first method of obtaining an output signal from a direct current (DC) voltage further comprising: getting at least one slave output signals comprising the following steps for each slave output signal from its corresponding slave secondary winding unit of the flyback transformer, wherein the flyback transformer further comprises at least one slave secondary winding units that each slave secondary winding unit comprising a secondary winding or two secondary windings is for generating a corresponding slave output signal: blocking a current in the corresponding secondary winding unit when the current in the primary winding is switched on; conducting a current from the corresponding slave secondary winding units to a filter positively or negatively according to the polarity of the pulse modulated signal when the current in the primary winding is switched off; filtering the current from the corresponding slave secondary winding unit for outputting the slave output signal.

Another aspect of the present invention provides a second method of obtaining an output signal from a direct current (DC) voltage, wherein the output signal is linearly amplified replica of an input signal having first and second polarities, comprising the steps of: receiving the input signal; transforming the input signal for generating a discrete time peak current signal, wherein said transforming is according to that when applying the direct current (DC) voltage across an inductance means, the energy stored in the inductance means is proportional to square of the peak current of the inductance means; switching a current from the direct current (DC) voltage to the inductance means and getting a feedback current signal by detecting the current of the inductance means, wherein said switching is according to the discrete time peak current signal and the feedback current signal; blocking a current from the inductance means to a filter when the current from the direct current (DC) voltage to the inductance means is switched on, and conducting the current from the inductance means to the filter positively or negatively according to the polarity of the input signal when the current from the direct current (DC) voltage to the inductance means is switched off; filtering said current from the inductance means for outputting the output signal by the filter. Wherein the inductance means is an inductor or a flyback transformer comprising a primary winding and a secondary winding unit which is a secondary winding or two secondary windings.

Another aspect of the present invention, wherein the second method of obtaining an output signal from a direct current (DC) voltage further comprising: getting at least one slave output signals comprising the following steps for each slave output signal from its corresponding slave secondary winding unit of the flyback transformer, wherein the flyback transformer further comprises at least one slave secondary winding units that each slave secondary winding unit comprising a secondary winding or two secondary windings is for generating a corresponding slave output signal: blocking a current in the corresponding secondary winding unit when the current in the primary winding is switched on; conducting a current from the corresponding slave secondary winding units to a filter positively or negatively according to the polarity of the pulse modulated signal when the current in the primary winding is switched off; filtering the current from the corresponding slave secondary winding unit for outputting the slave output signal by the filter.

Yet another aspect of the present invention provides a switching amplifier further comprising one or more than one slave outputs.

Yet another aspect of the present invention provides a switching amplifier further comprising a negative feedback signal generator to generate a negative feedback signal corresponding to the output signal, wherein the amplifier control unit integrates the input signal and the negative feedback signal to process a negative feedback control.

Yet another aspect of the present invention provides a switching amplifier further comprising a rectifying and smoothing unit to rectify and smooth an alternating current (AC) voltage and to provide the direct current (DC) voltage.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
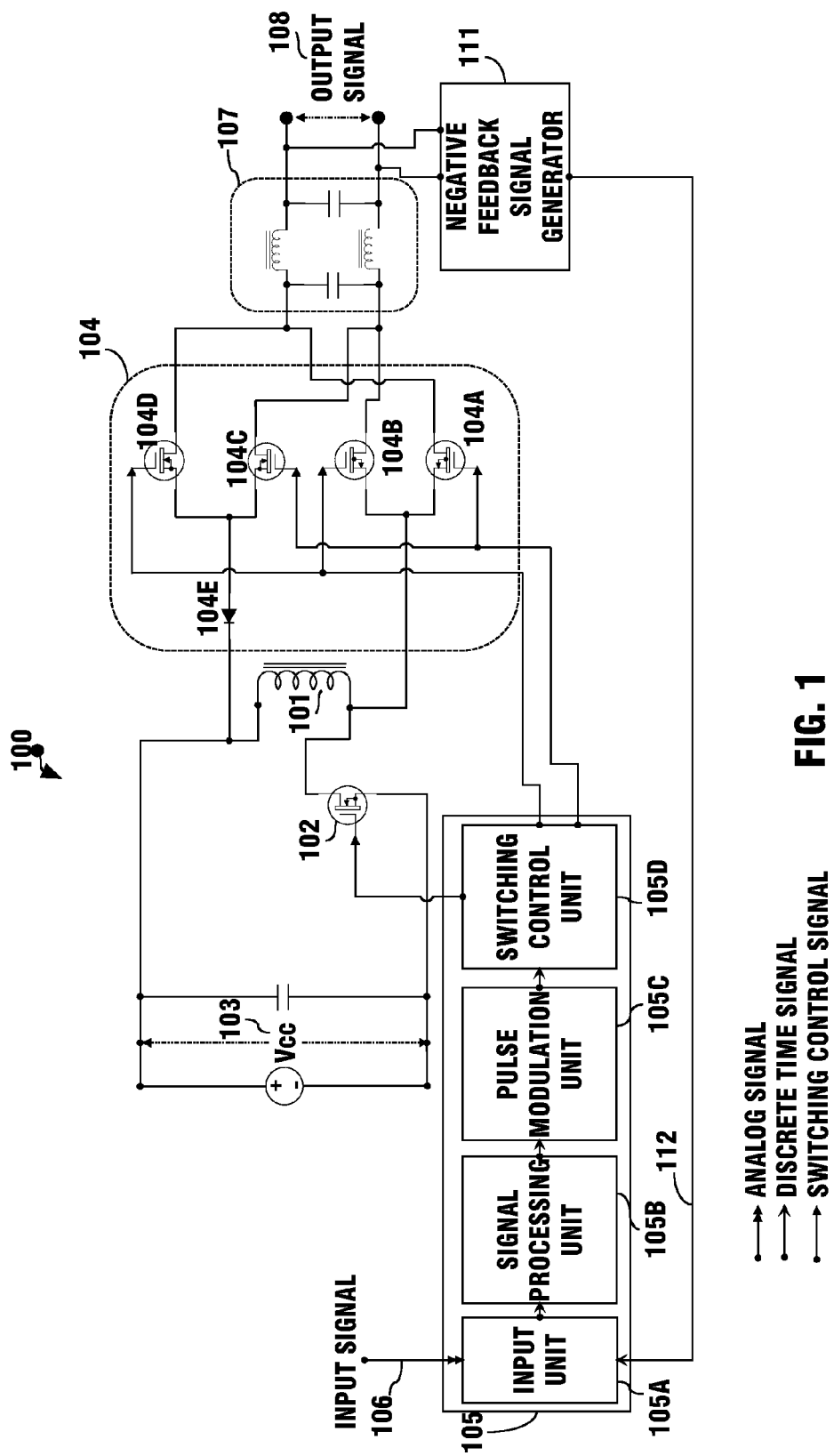
FIG. 1 is an exemplary block and circuit diagram illustrating a first embodiment of a switching amplifier in accordance with the first method of present invention, wherein the inductance means is an inductor.

FIG. 1 is an exemplary block and circuit diagram illustrating a first embodiment of a switching amplifier 100 in accordance with the first method of present invention, wherein the inductance means is an inductor 101.

As illustrated in FIG. 1, the switching amplifier 100 of the present invention for amplifying an input signal 106 having positive and negative polarities is comprised of: an inductance means 101; a switching unit 102 coupled to the inductance means 101 for switching a current from a direct current (DC) voltage 103 to the inductance means 101; a switching power transmitting unit 104 comprising four switches 104A~104D and one rectifier diode means 104E, wherein the switching power transmitting unit 104 coupled to the inductance means 101 for blocking a current from the inductance means 101 to a filter 107 when the current from the direct current (DC) voltage 103 to the inductance means 101 is switched on by the switching unit 102, and conducting the current from the inductance means 101 to the filter unit 107 positively or negatively according to the polarity of the input signal 106 when the current from the direct current (DC) voltage 103 to the inductance means 101 is switched off by the switching unit 102; an amplifier control unit 105 for receiving the input signal 106 and coupled to the switching unit 102 and the switching power transmitting unit 104 to control their switching according to the input signal 106; the filter unit 107 to obtain an output signal 108 corresponding to the input signal 106 by filtering the output of the switching power transmitting unit 104 and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 1, the inductance means 101 is an inductor operated in discontinuous mode. Accordingly, when the current from the direct current (DC) voltage 103 to the inductance means 101 is switched on, the current from the inductance means 101 to the filter unit 107 is blocked by the rectifier diode means 104E of the switching power transmitting unit 104. Therefore, during this switched on period, the current in the inductance means 101 builds up linearly in it from zero to a peak value. Further, when the current from the direct current (DC) voltage 103 to the inductance means 101 is switched off, the current from the inductance means 101 to the filter unit 107 is conducted positively or negatively by the switching power transmitting unit 104 for delivering previously stored energy to the filter unit 107.

Therefore, during the period when the current from the direct current (DC) voltage 103 to the inductance means 101 is switched on, the direct current (DC) voltage 103 is applied across the inductance means 101, and the current in the inductance means 101 builds up linearly from zero to a peak value which is proportional to the switched on period. Therefore, during the switched on period, the energy stored in the inductance means 101 is based on the equation:

$$E = \frac{L_p(I_p)^2}{2}$$

Wherein E is the energy stored, $L_p$ is the inductance of the inductance means 101, and $I_p$ is the peak value of the current in the inductance means 101 at the end of the switched on period. Since the peak value $I_p$ is proportional to the switched on period $T_{on}$:

$$I_p \propto T_{on} ==> E \propto (T_{on})^2$$

Therefore, the energy stored into the inductance means 101 during a switched on period is proportional to square of the switched on period.

As further illustrated in FIG. 1, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a signal processing unit 105B for transforming the discrete time input signal x[n] to a transformed signal y[n] according to the following equation:

$$y[n]=\sqrt[2]{x[n]}, 0<n<\infty;$$

a pulse modulation unit 105C for getting a pulse modulated signal from pulse modulating the transformed signal y[n] from the signal processing unit 105B; and a switching control unit 105D coupled to the switches of the switching unit 102 and the switches 104A, 104B, 104C, 104D of the switching power transmitting unit 104 to control their switching according to the pulse modulated signal from the pulse modulation unit 105C.

As further illustrated in FIG. 1, the exemplary transforming operated in the signal processing unit 105B according to the equation above is based on that the input signal 105 represents instantaneous energy to be delivered. Therefore the equation of the transforming operated in the signal processing unit 105B mentioned above should be changed or adjusted if the input signal 105 has different definition.

Figure 2:
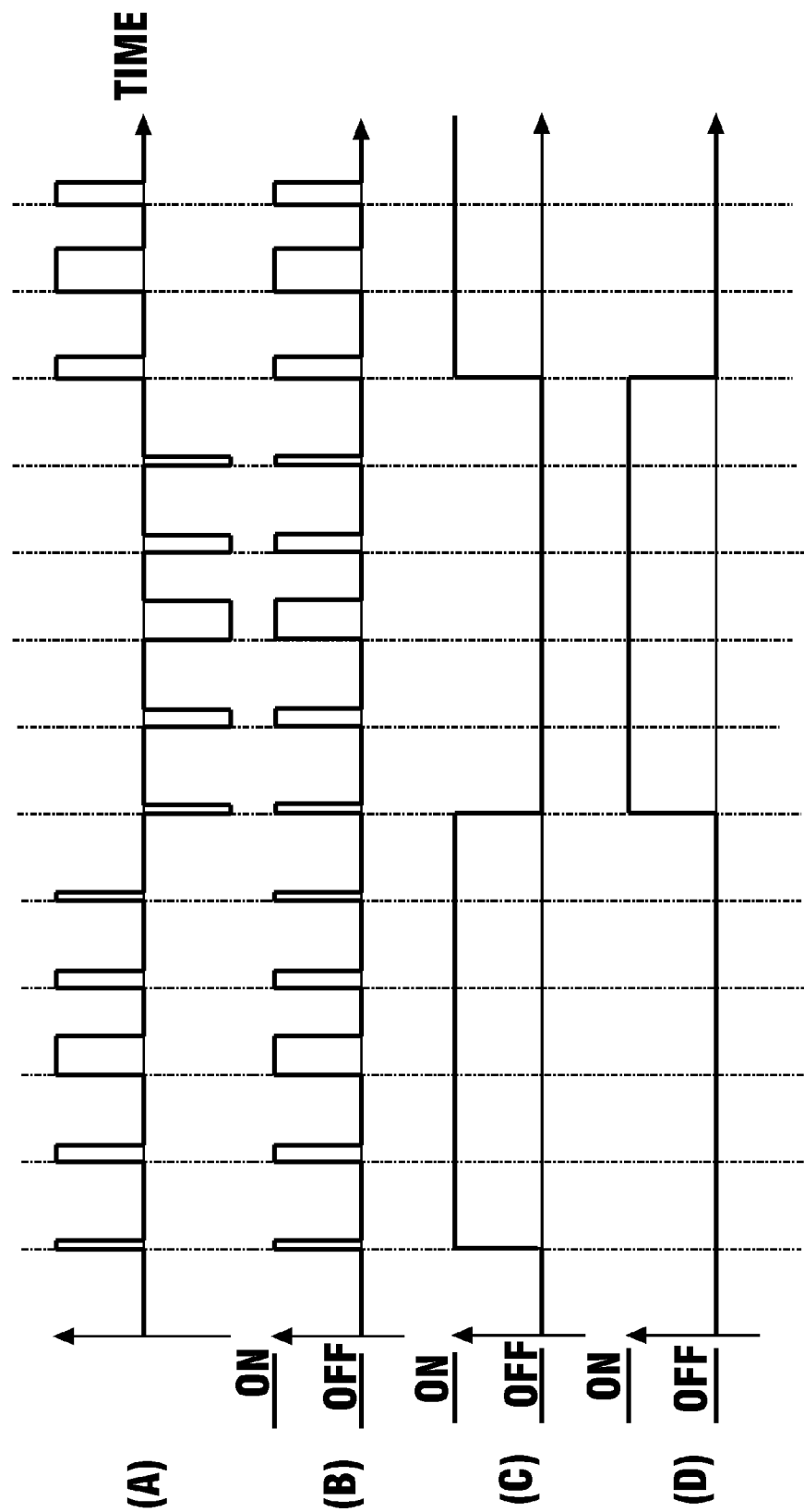
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105D to the switch 102A for controlling its switching is illustrated in FIG. 2(B). Also according to the pulse modulated signal illustrated in FIG. 2(A), non-limiting exemplary waveforms of switching control signals from the switching control unit 105D to the switches 104A, 104C and 104B, 104D are illustrated in FIG. 2(C) and FIG. 2(D), respectively.

Accordingly, as illustrated in FIG. 1 and FIG. 2, when the input signal 106 is zero, the switch of the switching unit 102 and the switches 104A, 104B, 104C and 104B of the switching power transmitting unit 104 are all switched off.

When the input signal 106 is not zero, the switch 102 switches the current from a direct current (DC) voltage 103 to the inductance means 101 according to the pulse modulated signal transformed and pulse modulated from the input signal 106. The rectifier diode means 104E blocks the current from the inductance means 101 to the filter unit 107 when the current from a direct current (DC) voltage 103 to the inductance means 101 is switched on by the switching unit 102. And when the polarity of the pulse modulated signal FIG. 2(A) is positive, the switches 104A, 104C switch on to conduct the current from the inductance means 101 to the filter unit 107 positively when the current from a direct current (DC) voltage 103 to the inductance means 101 is switched off by the switching unit 102; otherwise, when the polarity of the pulse modulated signal FIG. 2(A) is negative, the switches 104B and 104D switch on to conduct the current from the inductance means 101 to the filter unit 107 negatively when the current from a direct current (DC) voltage 103 to the inductance means 101 is switched off by the switching unit 102, As further illustrated in FIG. 1, the filter unit 107 is a low pass filter to obtain the output signal 108 corresponding to the input signal 106 by filtering the output of the switching power transmitting unit 104 and outputting the output signal 108.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
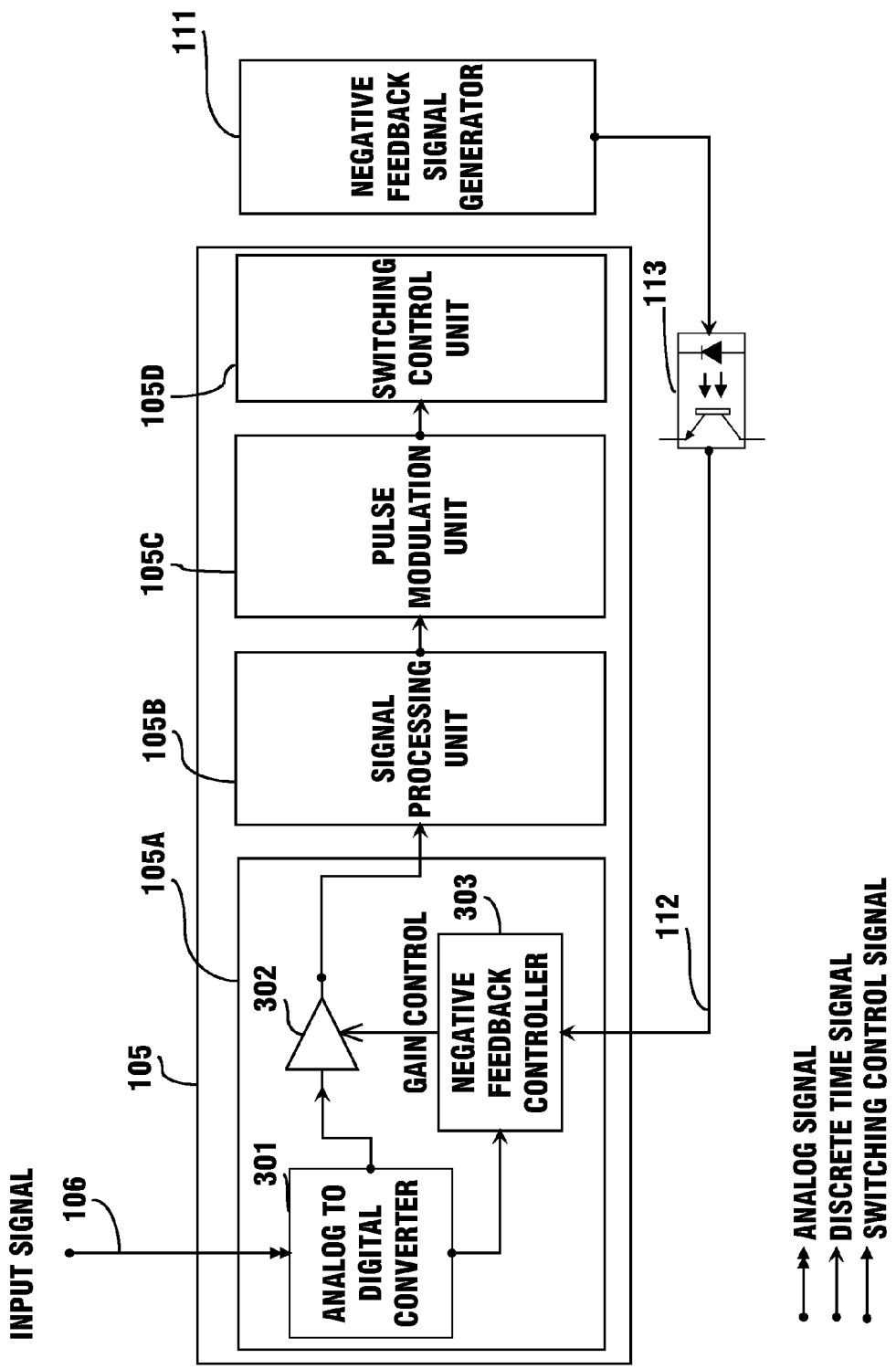
FIG. 3 is an exemplary block and circuit diagram illustrating an embodiment of the amplifier control unit integrating an input signal and a negative feedback signal in FIGS. 1, 4 and 5 in accordance with the present invention.
Figure 4:
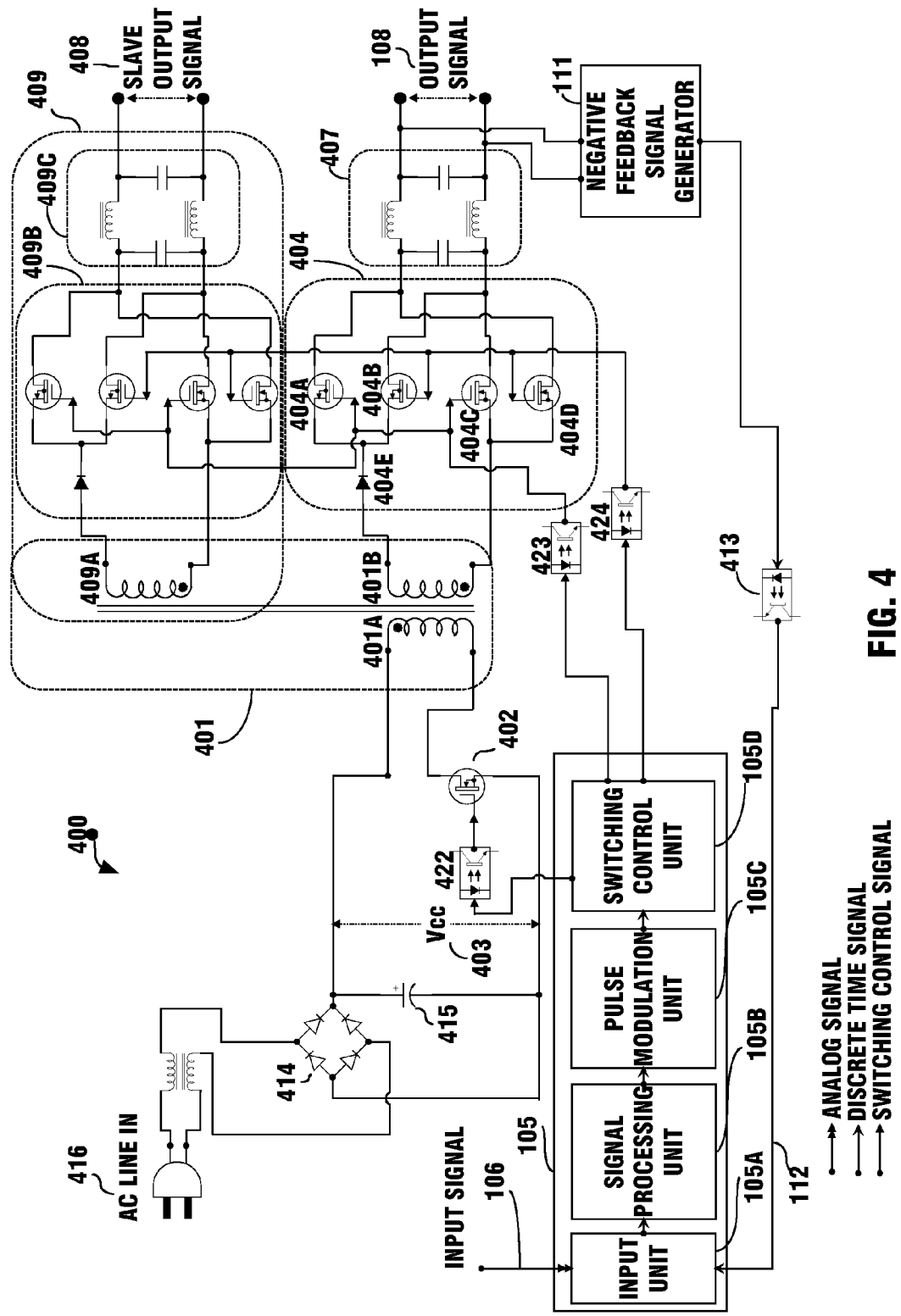
FIG. 4 is an exemplary block and circuit diagram illustrating a second embodiment of a switching amplifier in accordance with the first method of present invention, wherein the inductance means is a flyback transformer comprising a primary winding and a secondary winding unit which is a secondary winding.
Figure 5:
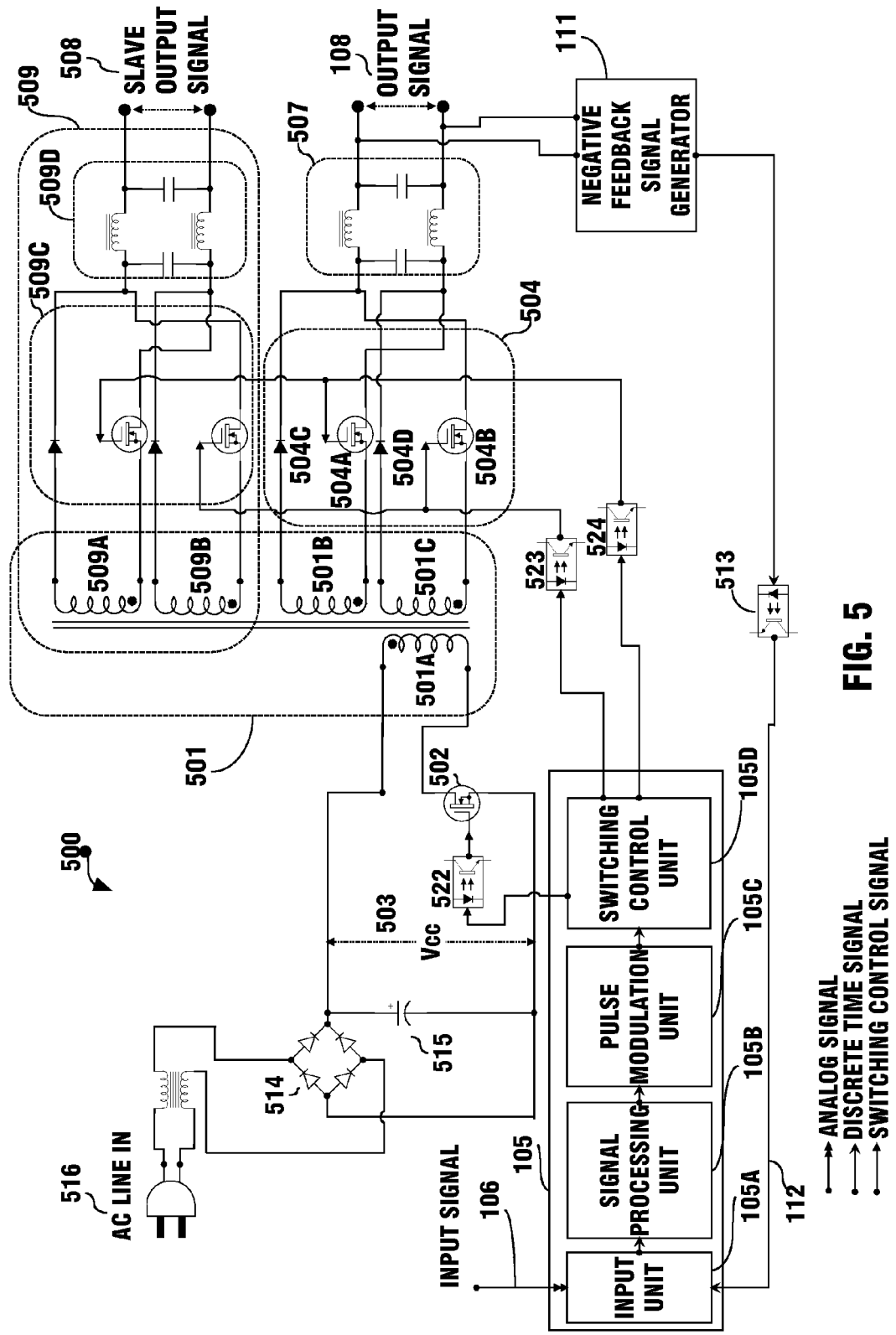
FIG. 5 is an exemplary block and circuit diagram illustrating a third embodiment of a switching amplifier in accordance with the first method of present invention, wherein the inductance means is a flyback transformer comprising a primary winding and a secondary winding unit which comprises two secondary windings.

FIG. 3 is an exemplary block and circuit diagram illustrating an embodiment of the amplifier control unit 105 integrating the input signal 106 and a negative feedback signal 112 in FIGS. 1, 4 and 5 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x = \{x[n]\}, 0 < n < \infty;$$

The linear digital transformer 302 transforms the discrete time input signal x[n] by multiplying a gain G to the discrete time input signal (the default value of the gain G is 1):

$$X[n] = \{G \times x[n]\}, 0 < n < \infty$$

to get a compensated discrete time signal X[n] and sends the compensated discrete time signal X[n] to the signal processing unit 105B.
Accordingly, for the switching amplifier 100 further comprises the negative feedback signal generator 111 to generate the negative feedback signal corresponding to the output signal 112 and the amplifier control unit 105 integrates the input signal 106 and the negative feedback signal 112, the signal processing unit 105B receives the compensated discrete time signal X[n], and the output of the signal processing unit 105B is:

$$y[n] = \sqrt[2]{X[n]}, 0 < n < \infty.$$

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

FIG. 4 is an exemplary block and circuit diagram illustrating a second embodiment of a switching amplifier 400 in accordance with the first method of present invention, wherein the inductance means is a flyback transformer 401 comprising a primary winding 401A and a secondary winding unit which is a secondary winding 401B.

As illustrated in FIG. 4, the switching amplifier 400 of the present invention for amplifying an input signal 106 having positive and negative polarities is comprised of: a flyback transformer 401 comprising a primary winding 401A and a secondary winding 401B; a switching unit 402 coupled to the primary winding 401A for switching a current from a direct current (DC) voltage 403 to the primary winding 401A; a switching power transmitting unit 404 comprising four switches 404A, 404B, 404C, 404D and one rectifier diode means 404E, wherein the switching power transmitting unit 404 coupled to the secondary winding 401B for blocking a current from the secondary winding 401B to a filter 407 when the current from the direct current (DC) voltage 403 to the primary winding 401A is switched on by the switching unit 402, and conducting the current from the secondary winding 401B to the filter unit 407 positively or negatively according to the polarity of the input signal 106 when the current from the direct current (DC) voltage 403 to the primary winding 401A is switched off by the switching unit 402; an amplifier control unit 105 for receiving the input signal 106 and coupled to the switching unit 402 and the switching power transmitting unit 404 to control their switching according to the input signal 106; the filter unit 407 to obtain an output signal 108 corresponding to the input signal 106 by filtering the output of the switching power transmitting unit 404 and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 4, the flyback transformer 401 is operated in discontinuous mode. Accordingly, when the current from the direct current (DC) voltage 403 to the primary winding 401A is switched on, the current from the secondary winding 401B to the filter unit 407 is blocked by the rectifier diode means 404E of the switching power transmitting unit 404. Therefore, during this switched on period, the current in the primary winding 401A builds up linearly in it from zero to a peak value. Further, when the current from the direct current (DC) voltage 403 to the primary winding 401A is switched off, the current from the secondary winding 401B to the filter unit 407 is conducted positively or negatively by the switching power transmitting unit 404 for delivering previously stored energy to the filter unit 407.

Therefore, during the period when the current from the direct current (DC) voltage 403 to the primary winding 401A is switched on, the direct current (DC) voltage 403 is applied across the primary winding 401A, and the current in the primary winding 401A builds up linearly from zero to a peak value which is proportional to the switched on period. Therefore, during the switched on period, the energy stored in the primary winding 401A is based on the equation:

$$E = \frac{L_p(I_p)^2}{2}$$

Wherein E is the energy stored, $L_p$ is the inductance of the primary winding 401A, and $I_p$ is the peak value of the current in the primary winding 401A at the end of the switched on period. Since the peak value $I_p$ is proportional to the switched on period $T_{on}$:

$$I_p \propto T_{on} ==> E \propto (T_{on})^2$$

Therefore, the energy stored into the primary winding 401A during a switched on period is proportional to square of the switched on period.

As further illustrated in FIG. 4, the amplifier control unit 105 comprises an input unit 105A for receiving the input signal 106 and having an analog to digital converter for converting the input signal 106 to a discrete time input signal x[n]

$$x = \{x[n]\}, 0 < n < \infty;$$

a signal processing unit 105B for transforming the discrete time input signal x[n] to a transformed signal y[n] according to the following equation:

$$y[n] = \sqrt[2]{x[n]}, 0 < n < \infty;$$

a pulse modulation unit 105C for getting a pulse modulated signal from pulse modulating the transformed signal y[n] from the signal processing unit 105B; and a switching control unit 105D coupled to the switches of the switching unit 402 and the switches 404A, 404B, 404C, 404D of the switching power transmitting unit 404 to control their switching according to the pulse modulated signal from the pulse modulation unit 105C.

As further illustrated in FIG. 4, the exemplary transforming operated in the signal processing unit 105B according to the equation above is based on that the input signal 105 represents instantaneous energy to be delivered. Therefore the equation of the transforming operated in the signal processing unit 105B mentioned above should be changed or adjusted if the input signal 105 has different definition.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105D to the switch 402 for controlling its switching is illustrated in FIG. 2(B). Also according to the pulse modulated signal illustrated in FIG. 2(A), non-limiting exemplary waveforms of switching control signals from the switching control unit 105D to the switches 404A, 404C and 404B, 404D are illustrated in FIG. 2(C) and FIG. 2(D), respectively.

Accordingly, as illustrated in FIG. 4 and FIG. 2, when the input signal 106 is zero, the switch of the switching unit 402 and the switches 404A, 404B, 404C and 404B of the switching power transmitting unit 404 are all switched off.

When the input signal 106 is not zero, the switch 402 switches the current from a direct current (DC) voltage 403 to the primary winding 401A according to the pulse modulated signal transformed and pulse modulated from the input signal 106. The rectifier diode means 404E blocks the current from the secondary winding 401B to the filter unit 407 when the current from a direct current (DC) voltage 403 to the primary winding 401A is switched on by the switching unit 402. And when the polarity of the pulse modulated signal FIG. 2(A) is positive, the switches 404A, 404C switch on to conduct the current from the secondary winding 401B to the filter unit 407 positively when the current from a direct current (DC) voltage 403 to the primary winding 401A is switched off by the switching unit 402; otherwise, when the polarity of the pulse modulated signal FIG. 2(A) is negative, the switches 404B and 404D switch on to conduct the current from the secondary winding 401B to the filter unit 407 negatively when the current from a direct current (DC) voltage 403 to the primary winding 401A is switched off by the switching unit 402, As further illustrated in FIG. 4, the filter unit 407 is a low pass filter to obtain the output signal 108 corresponding to the input signal 106 by filtering the output of the switching power transmitting unit 404 and outputting the output signal 108.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4 and 5 in accordance with the present invention.

As illustrated in FIG. 3 and FIG. 4, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\}, 0<n<\infty;$$

The linear digital transformer 302 transforms the discrete time input signal x[n] by multiplying a gain G to the discrete time input signal (the default value of the gain G is 1):

$$X[n]=\{G \times x[n]\}, 0<n<\infty$$

to get a compensated discrete time signal X[n] and sends the compensated discrete time signal X[n] to the signal processing unit 105B.

Accordingly, for the switching amplifier 100 further comprises the negative feedback signal generator 111 to generate the negative feedback signal corresponding to the output signal 112 and the amplifier control unit 105 integrates the input signal 106 and the negative feedback signal 112, the signal processing unit 105B receives the compensated discrete time signal X[n], and the output of the signal processing unit 105B is:

$$y[n]=\sqrt[2]{X[n]}, 0<n<\infty.$$

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

As further illustrated in FIG. 4, the switching amplifier 400 further comprising one slave output unit 409 or more than one slave output units to obtain one or more than one slave output signals 408, wherein each slave output unit 409 comprises: the flyback transformer 401 further comprising a slave secondary winding unit comprising a secondary winding 409A; a switching power transmitting unit 409B coupled to the slave secondary winding unit 409A for blocking a current in the slave secondary winding unit 409A when the current in the primary winding 401A is switched on by the switching unit 402, and conducting the current in the slave secondary winding unit 409A positively or negatively according to the polarity of the input signal 106 when the current in the primary winding 401A is switched off; a slave filter unit 409C to obtain a slave output signal 408 corresponding to the input signal 106 by filtering the output of the switching power transmitting unit 409B and outputting the slave output signal 408.

As further illustrated in FIG. 4, the amplifying gain of the output signal 108 is according to the turn ratio between the primary winding 401A and the secondary winding 401B; and the amplifying gain of the slave output signal 408 is according to the turn ratio between the primary winding 401A and the slave secondary winding 409A. Therefore, it is easy for the switching amplifier 400 to obtain a plurality of output signals with different amplifying gains.

As further illustrated in FIG. 4, the amplifier control unit 105 of the switching amplifier 400 integrates the input signal 106 and the negative feedback signal 112 to process a negative feedback control. Accordingly, with the negative feedback control, the slave output signal 408 trends to track the output signal 108 for the direct current (DC) voltage 403 and load changes. Therefore, the switching amplifier 400 provides multiple output signals are substantially immune to power supply and load perturbations.

As further illustrated in FIG. 4, the switching amplifier 400 further comprises a photo coupler 413 coupled between the negative feedback signal generator 111 and the amplifier control unit 105 to provide electric isolation between the negative feedback signal generator 111 and the amplifier control unit 105.

As further illustrated in FIG. 4, the switching amplifier 400 further comprises isolator circuits 422 coupled between the switching unit 402 and the amplifier control unit 105 to provide electric isolation between the switching unit 402 and the amplifier control unit 105.

As further illustrated in FIG. 4, the switching amplifier 400 further comprises isolator circuits 423, 424 coupled between the switching power transmitting unit 404 and the amplifier control unit 105 to provide electric isolation between the switching power transmitting unit 404 and the amplifier control unit 105.

As further illustrated in FIG. 4, the switching amplifier 400 further comprises isolator circuits 423, 424 coupled between the slave switching power transmitting units 409B corresponding to slave output signals 408 and the amplifier control unit 105 to provide electric isolation between the slave switching power transmitting units 409B and the amplifier control unit 105.

As further illustrated in FIG. 4, the switching amplifier 400 further comprises a rectifying unit 414 and a smoothing unit 415 to rectify and smooth an alternating current (AC) voltage 416 and to provide the direct current (DC) voltage 403.

FIG. 5 is an exemplary block and circuit diagram illustrating a third embodiment of a switching amplifier 500 in accordance with the first method of present invention, wherein the inductance means is a flyback transformer 501 comprising a primary winding 501A and a secondary winding unit which comprises two secondary windings 501B, and 501C.

As illustrated in FIG. 5, the switching amplifier 500 of the present invention for amplifying an input signal 106 having positive and negative polarities is comprised of: a flyback transformer 501 comprising a primary winding 501A and two secondary windings 501B, 501C; a switching unit 502 coupled to the primary winding 501A for switching a current from a direct current (DC) voltage 503 to the primary winding 501A; a switching power transmitting unit 504 comprising two switches 504A, 504B and two rectifier diode means 504C and 504D, wherein the switching power transmitting unit 504 coupled to the secondary windings 501B, 501C for blocking a current from the secondary windings 501B, 501C to a filter 507 when the current from the direct current (DC) voltage 503 to the primary winding 501A is switched on by the switching unit 502, and conducting the current from the secondary windings 501B, 501C to the filter unit 507 positively or negatively according to the polarity of the input signal 106 when the current from the direct current (DC) voltage 503 to the primary winding 501A is switched off by the switching unit 502; an amplifier control unit 105 for receiving the input signal 106 and coupled to the switching unit 502 and the switching power transmitting unit 504 to control their switching according to the input signal 106; the filter unit 507 to obtain an output signal 108 corresponding to the input signal 106 by filtering the output of the switching power transmitting unit 504 and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 5, the flyback transformer 501 is operated in discontinuous mode. Accordingly, when the current from the direct current (DC) voltage 503 to the primary winding 501A is switched on, the current from the secondary windings 501B, 501C to the filter unit 507 is blocked by the rectifier diode means 504C, 504D of the switching power transmitting unit 504. Therefore, during this switched on period, the current in the primary winding 501A builds up linearly in it from zero to a peak value. Further, when the current from the direct current (DC) voltage 503 to the primary winding 501A is switched off, the current from the secondary windings 501B, 501C to the filter unit 507 is conducted positively or negatively by the switching power transmitting unit 504 for delivering previously stored energy to the filter unit 507.

Therefore, during the period when the current from the direct current (DC) voltage 503 to the primary winding 501A is switched on, the direct current (DC) voltage 503 is applied across the primary winding 501A, and the current in the primary winding 501A builds up linearly from zero to a peak value which is proportional to the switched on period. Therefore, during the switched on period, the energy stored in the primary winding 501A is based on the equation:

$$E = \frac{L_p(I_p)^2}{2}$$

Wherein E is the energy stored, $L_p$ is the inductance of the primary winding 501A, and $I_p$ is the peak value of the current in the primary winding 501A at the end of the switched on period. Since the peak value $I_p$ is proportional to the switched on period $T_{on}$:

$$I_p \propto T_{on} ==> E \propto (T_{on})^2$$

Therefore, the energy stored into the primary winding 501A during a switched on period is proportional to square of the switched on period.

As further illustrated in FIG. 5, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a signal processing unit 105B for transforming the discrete time input signal x[n] to a transformed signal y[n] according to the following equation:

$$y[n]=\sqrt[2]{x[n]}, 0<n<\infty;$$

a pulse modulation unit 105C for getting a pulse modulated signal from pulse modulating the transformed signal y[n] from the signal processing unit 105B; and a switching control unit 105D coupled to the switches of the switching unit 502 and the switches 504A, 504B of the switching power transmitting unit 504 to control their switching according to the pulse modulated signal from the pulse modulation unit 105C.

As further illustrated in FIG. 5, the exemplary transforming operated in the signal processing unit 105B using the equation above is based on that the input signal 105 represents instantaneous energy to be delivered. Therefore the equation of the transforming operated in the signal processing unit 105B mentioned above should be changed or adjusted if the input signal 105 has different definition.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105D to the switch 502 for controlling its switching is illustrated in FIG. 2(B). Also according to the pulse modulated signal illustrated in FIG. 2(A), non-limiting exemplary waveforms of switching control signals from the switching control unit 105D to the switches 504A and 504B are illustrated in FIG. 2(C) and FIG. 2(D), respectively.

Accordingly, as illustrated in FIG. 5 and FIG. 2, when the input signal 106 is zero, the switch of the switching unit 502 and the switches 504A and 504B of the switching power transmitting unit 504 are all switched off.

When the input signal 106 is not zero, the switch 502 switches the current from a direct current (DC) voltage 503 to the primary winding 501A according to the pulse modulated signal transformed and pulse modulated from the input signal 106. The rectifier diode means 504C, 504D blocks the current from the secondary windings 501B, 501C to the filter unit 507 when the current from a direct current (DC) voltage 503 to the primary winding 501A is switched on by the switching unit 502. And when the polarity of the pulse modulated signal FIG. 2(A) is positive, the switch 504A switches on to conduct the current from the secondary winding 501B to the filter unit 507 positively when the current from a direct current (DC) voltage 503 to the primary winding 501A is switched off by the switching unit 502; otherwise, when the polarity of the pulse modulated signal FIG. 2(A) is negative, the switch 504B switches on to conduct the current from the secondary winding 501C to the filter unit 507 negatively when the current from a direct current (DC) voltage 503 to the primary winding 501A is switched off by the switching unit 502, As further illustrated in FIG. 5, the filter unit 507 is a low pass filter to obtain the output signal 108 corresponding to the input signal 106 by filtering the output of the switching power transmitting unit 504 and outputting the output signal 108.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

FIG. 3 is an exemplary block and circuit diagram illustrating an embodiment of the amplifier control unit 105 integrating the input signal 106 and a negative feedback signal 112 in FIGS. 1, 4 and 5 in accordance with the present invention.

As illustrated in FIG. 3 and FIG. 5, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$x=\{x[n]\}, 0<n<\infty;$

The linear digital transformer 302 transforms the discrete time input signal x[n] by multiplying a gain G to the discrete time input signal (the default value of the gain G is 1):

$X[n]=\{G \times x[n]\}, 0<n<\infty$ to get a compensated discrete time signal X[n] and sends the compensated discrete time signal X[n] to the signal processing unit 105B.

Accordingly, for the switching amplifier 100 further comprises the negative feedback signal generator 111 to generate the negative feedback signal corresponding to the output signal 112 and the amplifier control unit 105 integrates the input signal 106 and the negative feedback signal 112, the signal processing unit 105B receives the compensated discrete time signal X[n], and the output of the signal processing unit 105B is:

$y[n]=\sqrt[2]{X[n]}, 0<n<\infty.$

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

As further illustrated in FIG. 5, the switching amplifier 500 further comprising one slave output unit 509 or more than one slave output units to obtain one or more than one slave output signals 508, wherein each slave output unit 509 comprises: the flyback transformer 501 further comprising a slave secondary winding unit comprising two secondary windings 509A, 509B; a switching power transmitting unit 509C coupled to the slave secondary winding unit 509A, 509B for blocking a current in the slave secondary winding unit 509A, 509B when the current in the primary winding 501A is switched on by the switching unit 502, and conducting the current in the slave secondary winding unit 509A, 509B positively or negatively according to the polarity of the input signal 106 when the current in the primary winding 501A is switched off; a slave filter unit 509D to obtain a slave output signal 508 corresponding to the input signal 106 by filtering the output of the switching power transmitting unit 509C and outputting the slave output signal 508.

As further illustrated in FIG. 5, the amplifying gain of the output signal 108 is according to the turn ratio between the primary winding 501A and the secondary windings 501B, 501C; and the amplifying gain of the slave output signal 508 is according to the turn ratio between the primary winding 501A and the slave secondary windings 509A, 509B. Therefore, it is easy for the switching amplifier 500 to obtain a plurality of output signals with different amplifying gains.

As further illustrated in FIG. 5, the amplifier control unit 105 of the switching amplifier 500 integrates the input signal 106 and the negative feedback signal 112 to process a negative feedback control. Accordingly, with the negative feedback control, the slave output signal 508 trends to track the output signal 108 for the direct current (DC) voltage 503 and load changes. Therefore, the switching amplifier 500 provides multiple output signals are substantially immune to power supply and load perturbations.

As further illustrated in FIG. 5, the switching amplifier 500 further comprises a photo coupler 513 coupled between the negative feedback signal generator 111 and the amplifier control unit 105 to provide electric isolation between the negative feedback signal generator 111 and the amplifier control unit 105.

As further illustrated in FIG. 5, the switching amplifier 500 further comprises isolator circuits 522 coupled between the switching unit 502 and the amplifier control unit 105 to provide electric isolation between the switching unit 502 and the amplifier control unit 105.

As further illustrated in FIG. 5, the switching amplifier 500 further comprises isolator circuits 523, 524 coupled between the switching power transmitting unit 504 and the amplifier control unit 105 to provide electric isolation between the switching power transmitting unit 504 and the amplifier control unit 105.

As further illustrated in FIG. 5, the switching amplifier 500 further comprises isolator circuits 523, 524 coupled between the slave switching power transmitting units 509C corresponding to slave output signals 508 and the amplifier control unit 105 to provide electric isolation between the slave switching power transmitting units 509C and the amplifier control unit 105.

As further illustrated in FIG. 5 the switching amplifier 50 further comprises a rectifying unit 514 and a smoothing unit 515 to rectify and smooth an alternating current (AC) voltage 516 and to provide the direct current (DC) voltage 503.

Figure 6:
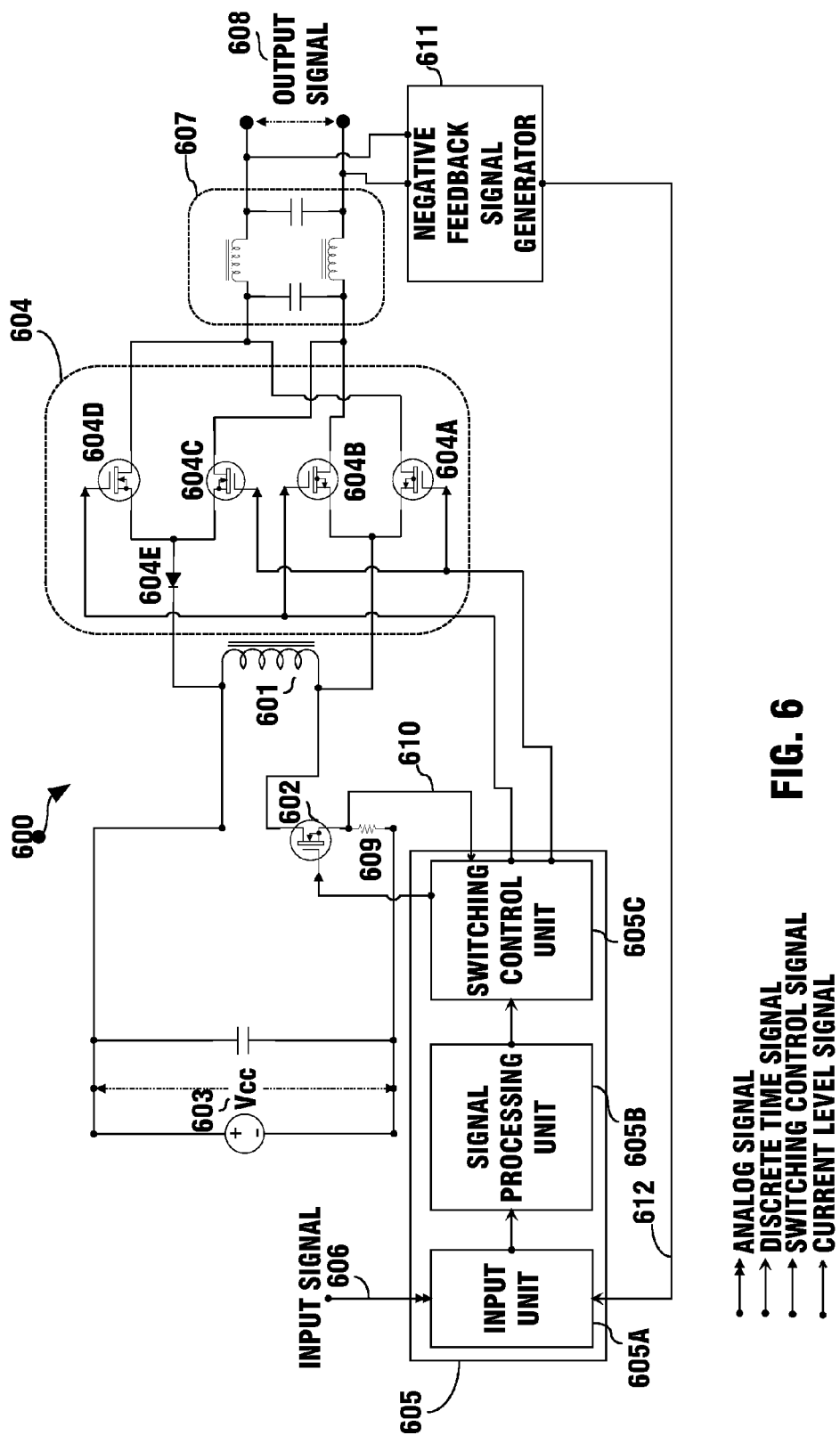
FIG. 6 is an exemplary block and circuit diagram illustrating a fourth embodiment of a switching amplifier in accordance with the second method of present invention, wherein the inductance means is an inductor.

FIG. 6 is an exemplary block and circuit diagram illustrating a fourth embodiment of a switching amplifier 600 in accordance with the second method of present invention, wherein the inductance means is an inductor 601.

As illustrated in FIG. 6, the switching amplifier 600 of the present invention for amplifying an input signal 606 having positive and negative polarities is comprised of: an inductance means 601; a switching unit 602 coupled to the inductance means 601 for switching a current from a direct current (DC) voltage 603 to the inductance means 601; a switching power transmitting unit 604 comprising four switches 604A, 604B, 604C, 604D and one rectifier diode means 604E, wherein the switching power transmitting unit 604 coupled to the inductance means 601 for blocking a current from the inductance means 601 to a filter 607 when the current from the direct current (DC) voltage 603 to the inductance means 601 is switched on by the switching unit 602, and conducting the current from the inductance means 601 to the filter unit 607 positively or negatively according to the polarity of the input signal 606 when the current from the direct current (DC) voltage 603 to the inductance means 601 is switched off by the switching unit 602; an amplifier control unit 605 for receiving the input signal 606 and coupled to the switching unit 602 and the switching power transmitting unit 604 to control their switching according to the input signal 606; the filter unit 607 to obtain an output signal 608 corresponding to the input signal 606 by filtering the output of the switching power transmitting unit 604 and outputting the output signal 608.

As illustrated in FIG. 6, the switching amplifier 600 further comprises a negative feedback current signal generator 609 which is a resistor to sense a current for generating a negative feedback current signal 610 corresponding to the current of the inductance means 601, wherein the amplifier control unit 605 integrates the input signal 606 and the negative feedback current signal 610 to process a negative feedback control In this non-limiting exemplary embodiment, the input signal 606 is an analog signal. And it is obvious for a corresponding embodiment of a switching amplifier in accordance with this invention if the input signal is a discrete time signal.

As further illustrated in FIG. 6, the inductance means 601 is an inductor operated in discontinuous mode. Accordingly, when the current from the direct current (DC) voltage 603 to the inductance means 601 is switched on, the current from the inductance means 601 to the filter unit 607 is blocked by the rectifier diode means 604E of the switching power transmitting unit 604. Therefore, during this switched on period, the current in the inductance means 601 builds up linearly in it from zero to a peak value. Further, when the current from the direct current (DC) voltage 603 to the inductance means 601 is switched off, the current from the inductance means 601 to the filter unit 607 is conducted positively or negatively by the switching power transmitting unit 604 for delivering previously stored energy to the filter unit 607.

Therefore, during the period when the current from the direct current (DC) voltage 603 to the inductance means 601 is switched on, the direct current (DC) voltage 603 is applied across the inductance means 601, and the current in the inductance means 601 builds up linearly from zero to a peak value which is proportional to the switched on period. Therefore, during the switched on period, the energy stored in the inductance means 101 is based on the equation:

$$E = \frac{L_p(I_p)^2}{2}$$

Wherein E is the energy stored, $L_p$ is the inductance of the inductance means 601, and $I_p$ is the peak value of the current of the inductance means 601 at the end of the switched on period. Therefore, the energy stored into the inductance means 601 during a switched on period is proportional to the square of the peak current of the inductance means 601.

As further illustrated in FIG. 6, the amplifier control unit 605 comprises: An input unit 605A for receiving the input signal 606 and having an analog to digital converter for converting the input signal 606 to a discrete time input signal x[n]

$$x = \{x[n]\}, 0 < n < \infty;$$

wherein the sampling frequency of the discrete time input signal x[n] is according to the switching frequency of the switching units 602 and the switching power transmitting unit 604, therefore, each x[n] is corresponding to instantaneous amplitude of the input signal which corresponding to energy to be delivered at each switching;

A signal processing unit 605B for transforming the discrete time input signal x[n] to a discrete time peak current signal $I_p[n]$ according to the followings:

$$I_p[n] = \sqrt[2]{\frac{x[n]}{x_{max}}} \times I_{pmax}$$

$$0 < n < \infty;$$

wherein $x_{max}$ is the maximum value of the discrete time input signal and $I_{pmax}$ is the maximum value of peak current in the inductance means 601 at the end of the switched on period corresponding to $x_{max}$, wherein the $x_{max}$ and $I_{pmax}$ are all design parameters of the switching amplifier 600. Since the input signal 606 has first and second polarities, therefore, the discrete time peak current signal $I_p[n]$ also has first and second polarities; A switching control unit 605C coupled to the switching unit 602 and the switches 604A, 604B, 604C, 604D of the switching power transmitting unit 604 to control their switching according to the discrete time peak current signal $I_p[n]$ and the negative feedback current signal 610 corresponding to the current through the inductance means 601. When the input signal 606 is zero, the switches of the switching unit 602 and the switches 604A, 604B, 604C, 604D of the switching power transmitting unit 604 are all switched off. When the input signal 606 is not zero, the switch 602 switches the current from the direct current (DC) voltage 603 to the inductance means 601 according to the discrete time peak current signal $I_p[n]$ and the negative feedback current signal 610, for example, at start of each switching, for that the polarity of $I_p[n]$ is positive therefore the switches 604A, 604C are switched on and the switches 604B, 604D are switched off, the switching control unit 605C switches on the switch 602 and compares the discrete time peak current signal $I_p[n]$ to the negative feedback current signal 610. When the negative feedback current signal 610 reaches $I_p[n]$, the switching control unit 605C switches off the switch 602 and waits for next switching start. For that the polarity of $I_p[n]$ is negative therefore the switches 604A, 604C are switched off and the switches 604B, 604D are switched on, the switching control unit 605C switches the switches 602 according to the discrete time peak current signal $I_p[n]$ and the negative feedback current signal 610, respectively.

As further illustrated in FIG. 6, the exemplary transforming operated in the signal processing unit 605B according to the equation above is based on that the input signal 605 represents instantaneous energy to be delivered. Therefore the equation of the transforming operated in the signal processing unit 605B mentioned above should be changed or adjusted if the input signal 605 has different definition.

As further illustrated in FIG. 6, the filter unit 607 is a low pass filter to obtain the output signal 608 corresponding to the input signal 606 by filtering the output of the switching power transmitting unit 604 and outputting the output signal 608.

As further illustrated in FIG. 6, the switching amplifier 600 further comprises a negative feedback signal generator 611 to generate a negative feedback signal corresponding to the output signal 612, wherein the amplifier control unit 605 integrates the input signal 606 and the negative feedback signal 612.

Figure 7:
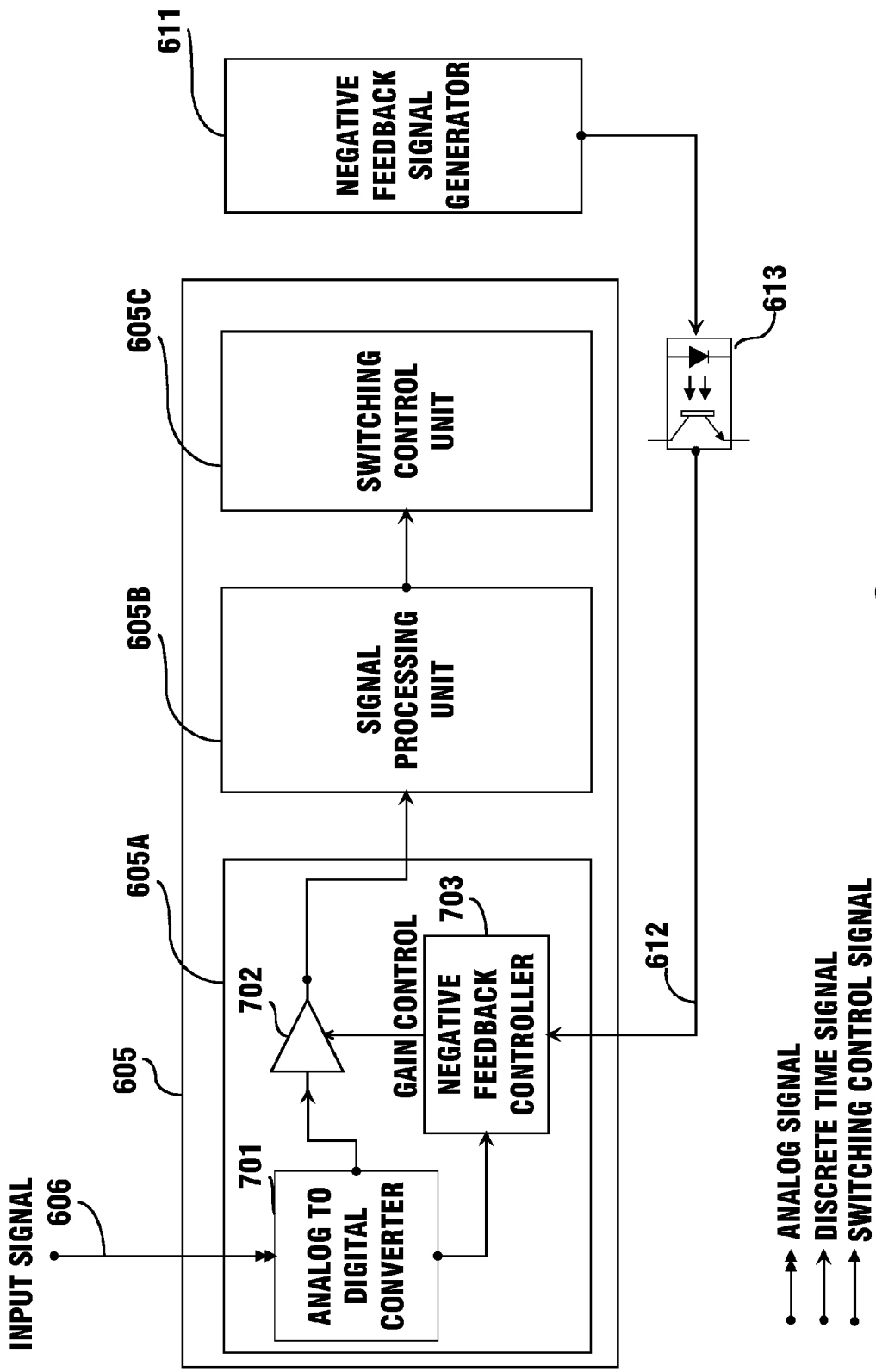
FIG. 7 is an exemplary block and circuit diagram illustrating an embodiment of the amplifier control unit integrating an input signal and a negative feedback signal in FIGS. 6, 8 and 9 in accordance with the present invention.
Figure 8:
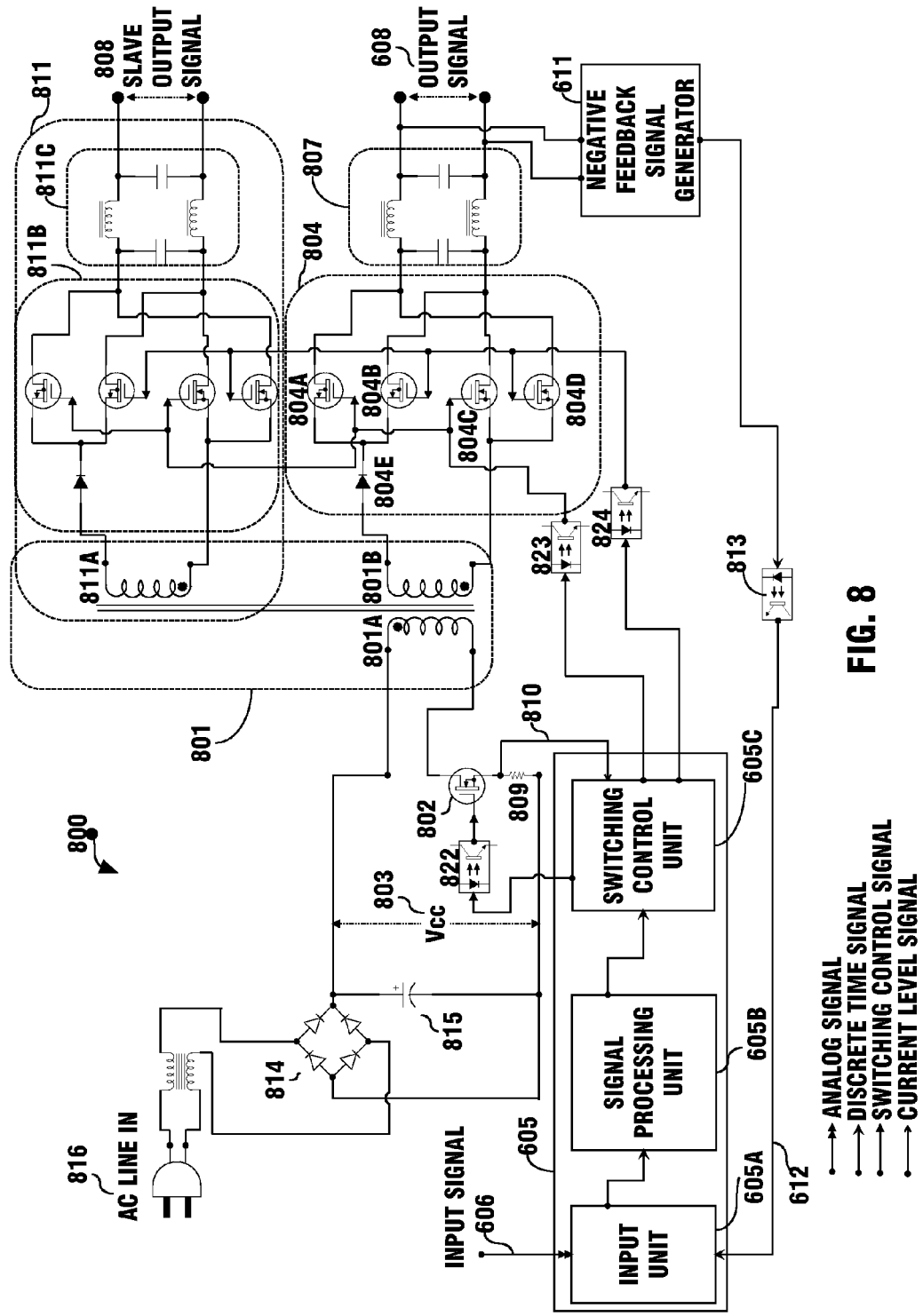
FIG. 8 is an exemplary block and circuit diagram illustrating an embodiment of a fifth switching amplifier in accordance with the second method of present invention, wherein the inductance means is a flyback transformer comprising a primary winding and a secondary winding unit which is a secondary winding.
Figure 9:
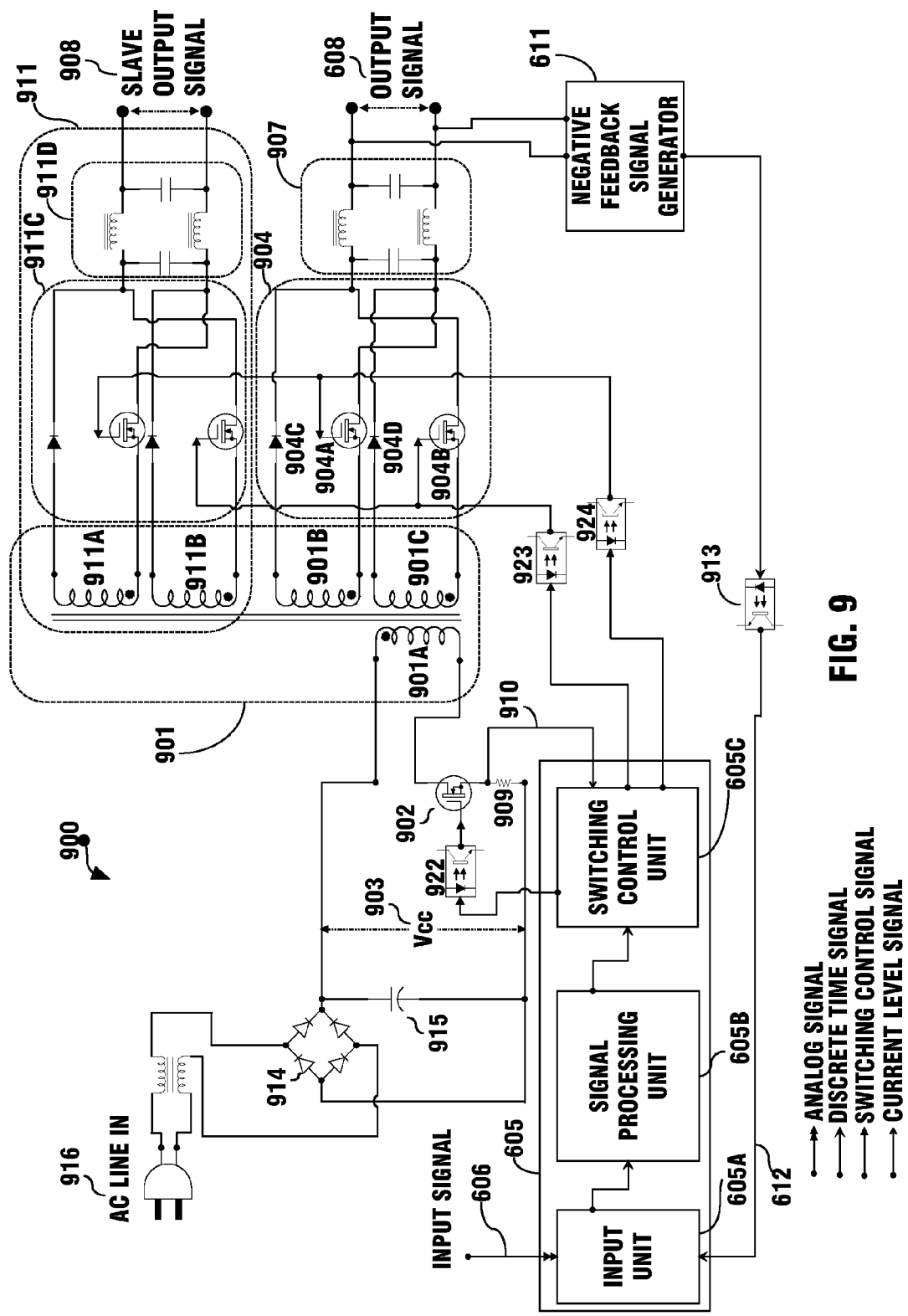
FIG. 9 is an exemplary block and circuit diagram illustrating a sixth embodiment of a switching amplifier in accordance with the second method of present invention, wherein the inductance means is a flyback transformer comprising a primary winding and a secondary winding unit which comprises two secondary windings.

FIG. 7 is an exemplary block and circuit diagram illustrating an embodiment of the amplifier control unit 605 integrating the input signal 606 and a negative feedback signal 612 in FIGS. 6, 8 and 9 in accordance with the present invention.

As illustrated in FIG. 7 and FIG. 6, the input unit 605A has an analog to digital converter 701 and further comprises a linear digital transformer 702 and a negative feedback controller 703. Wherein the analog to digital converter 701 receives the input signal 606 and converts the input signal 606 to a discrete time input signal x[n]:

$$x=\{x[n]\}, 0<n<\infty;$$

The linear digital transformer 702 transforms the discrete time input signal x[n] by multiplying a gain G to the discrete time input signal (the default value of the gain G is 1):

$$Y[n]=\{G \times x[n]\}, 0<n<\infty$$

to get a compensated discrete time signal Y[n] and sends the compensated discrete time signal Y[n] to the signal processing unit 605B.

Accordingly, for the switching amplifier 600 which further comprises the negative feedback signal generator 611 to generate the negative feedback signal 612 corresponding to the output signal 608 and the amplifier control unit 605 further integrating the negative feedback signal 612, the signal processing unit 605B receives the compensated discrete time signal Y[n], and the output of the signal processing unit 605B is:

$$I_p[n] = \sqrt[2]{\frac{Y[n]}{x_{max}}} \times I_{pmax}$$

$$0 < n < \infty;$$

As further illustrated in FIG. 7, the negative feedback controller 703 receives discrete time input signal from the analog to digital converter 701 and compares it to the negative feedback signal 612, and adjust the gain G of the linear digital transformer 702 according to the comparison. For example, if the negative feedback signal 612 corresponding to the output signal 608 shows that the output signal 608 is below a required level, then the negative feedback controller 703 will increase the gain G of the linear digital transformer 702 to increase the output signal 608, wherein said required level is obtained according to the discrete time input signal.

FIG. 8 is an exemplary block and circuit diagram illustrating an embodiment of a fifth switching amplifier 800 in accordance with the second method of present invention, wherein the inductance means is a flyback transformer 801 comprising a primary winding 801A and a secondary winding unit which is a secondary winding 801B.

As illustrated in FIG. 8, the switching amplifier 800 of the present invention for amplifying an input signal 606 having positive and negative polarities is comprised of: a flyback transformer 801 comprising a primary winding 801A and a secondary winding 801B; a switching unit 802 coupled to the primary winding 801A for switching a current from a direct current (DC) voltage 803 to the primary winding 801A; a switching power transmitting unit 804 comprising four switches 804A, 804B, 804C, 804D and one rectifier diode means 804E, wherein the switching power transmitting unit 804 coupled to the secondary winding 801B for blocking a current from the secondary winding 801B to a filter 807 when the current from the direct current (DC) voltage 803 to the primary winding 801A is switched on by the switching unit 802, and conducting the current from the secondary winding 801B to the filter unit 807 positively or negatively according to the polarity of the input signal 606 when the current from the direct current (DC) voltage 803 to the primary winding 801A is switched off by the switching unit 802; an amplifier control unit 605 for receiving the input signal 606 and coupled to the switching unit 802 and the switching power transmitting unit 804 to control their switching according to the input signal 606; the filter unit 807 to obtain an output signal 608 corresponding to the input signal 606 by filtering the output of the switching power transmitting unit 804 and outputting the output signal 608.

As illustrated in FIG. 8, the switching amplifier 800 further comprises a negative feedback current signal generator 809 which is a resistor to sense a current through the primary winding 801A for generating a negative feedback current signal 810 corresponding to the current of the primary winding 801A, wherein the amplifier control unit 605 integrates the input signal 606 and the negative feedback current signal 810 to process a negative feedback control In this non-limiting exemplary embodiment, the input signal 606 is an analog signal. However, a corresponding embodiment of a switching amplifier in accordance with this invention for an input signal which is a discrete time signal is obvious.

As further illustrated in FIG. 8, the flyback transformer 801 is operated in discontinuous mode. Accordingly, when the current from the direct current (DC) voltage 803 to the primary winding 801A is switched on, the current from the secondary winding 801B to the filter unit 807 is blocked by the rectifier diode means 804E of the switching power transmitting unit 804. Therefore, during this switched on period, the current in the primary winding 801A builds up linearly in it from zero to a peak value. Further, when the current from the direct current (DC) voltage 803 to the primary winding 801A is switched off, the current from the secondary winding 801B to the filter unit 807 is conducted positively or negatively by the switching power transmitting unit 804 for delivering previously stored energy to the filter unit 807.

Therefore, during the period when the current from the direct current (DC) voltage 803 to the primary winding 801A is switched on, the direct current (DC) voltage 803 is applied across the primary winding 801A, and the current in the primary winding 801A builds up linearly from zero to a peak value which is proportional to the switched on period. Therefore, during the switched on period, the energy stored in the primary winding 801A is based on the equation:

$$E = \frac{L_p(I_p)^2}{2}$$

Wherein E is the energy stored, $L_p$ is the inductance of the primary winding 801A, and $I_p$ is the peak value of the current of the primary winding 801A at the end of the switched on period. Therefore, the energy stored into the primary winding 801A during a switched on period is proportional to the square of the peak current of the primary winding 801A.

As further illustrated in FIG. 8, the amplifier control unit 605 comprises: An input unit 605A for receiving the input signal 606 and having an analog to digital converter for converting the input signal 606 to a discrete time input signal x[n]

$$x=\{x[n]\}, 0 < n < \infty;$$

wherein the sampling frequency of the discrete time input signal x[n] is according to the switching frequency of the switching units 802 and the switching power transmitting unit 804, therefore, each x[n] is corresponding to instantaneous amplitude of the input signal which corresponding to energy to be delivered at each switching;

A signal processing unit 605B for transforming the discrete time input signal x[n] to a discrete time peak current signal $I_p[n]$ according to the followings:

$$I_p[n] = \sqrt[2]{\frac{x[n]}{x_{max}}} \times I_{pmax}$$

$$0 < n < \infty;$$

wherein $x_{max}$ is the maximum value of the discrete time input signal and $I_{pmax}$ is the maximum value of peak current in the primary winding 801A at the end of the switched on period corresponding to $x_{max}$, wherein the $x_{max}$ and $I_{pmax}$ are all design parameters of the switching amplifier 800. Since the input signal 606 has first and second polarities, therefore, the discrete time peak current signal $I_p[n]$ also has first and second polarities; A switching control unit 605C coupled to the switching unit 802 and the switches 804A, 804B, 804C, 804D of the switching power transmitting unit 804 to control their switching according to the discrete time peak current signal $I_p[n]$ and the negative feedback current signal 810 corresponding to the current through the primary winding 801A. When the input signal 606 is zero, the switches of the switching unit 802 and the switches 804A, 804B, 804C, 804D of the switching power transmitting unit 804 are all switched off. When the input signal 606 is not zero, the switch 802 switches the current from the direct current (DC) voltage 803 to the primary winding 801A according to the discrete time peak current signal $I_p[n]$ and the negative feedback current signal 810, for example, at start of each switching, for that the polarity of $I_p[n]$ is positive therefore the switches 804A, 804C are switched on and the switches 804B, 804D are switched off, the switching control unit 605C switches on the switch 802 and compares the discrete time peak current signal $I_p[n]$ to the negative feedback current signal 810. When the negative feedback current signal 810 reaches $I_p[n]$, the switching control unit 605C switches off the switch 802 and waits for next switching start. For that the polarity of $I_p[n]$ is negative therefore the switches 804A, 804C are switched off and the switches 804B, 804D are switched on, the switching control unit 605C switches the switches 802 according to the discrete time peak current signal $I_p[n]$ and the negative feedback current signal 810, respectively.

As further illustrated in FIG. 8, the exemplary transforming operated in the signal processing unit 605B according to the equation above is based on that the input signal 605 represents instantaneous energy to be delivered. Therefore the equation of the transforming operated in the signal processing unit 605B mentioned above should be changed or adjusted if the input signal 605 has different definition.

As further illustrated in FIG. 8, the filter unit 807 is a low pass filter to obtain the output signal 608 corresponding to the input signal 606 by filtering the output of the switching power transmitting unit 804 and outputting the output signal 608.

As further illustrated in FIG. 8, the switching amplifier 800 further comprises a negative feedback signal generator 611 to generate a negative feedback signal corresponding to the output signal 612, wherein the amplifier control unit 605 integrates the input signal 606 and the negative feedback signal 612.

FIG. 7 is an exemplary block and circuit diagram illustrating an embodiment of the amplifier control unit 605 integrating the input signal 606 and a negative feedback signal 612 in FIGS. 6, 8 and 9 in accordance with the present invention.

As illustrated in FIG. 7 and FIG. 8, the input unit 605A has an analog to digital converter 701 and further comprises a linear digital transformer 702 and a negative feedback controller 703. Wherein the analog to digital converter 701 receives the input signal 606 and converts the input signal 606 to a discrete time input signal x[n]:

$$x=\{x[n]\}, 0 < n < \infty;$$

The linear digital transformer 702 transforms the discrete time input signal x[n] by multiplying a gain G to the discrete time input signal (the default value of the gain G is 1):

$$Y[n]=\{G \times x[n]\}, 0<n<\infty$$

to get a compensated discrete time signal Y[n] and sends the compensated discrete time signal Y[n] to the signal processing unit 605B.

Accordingly, for the switching amplifier 800 which further comprises the negative feedback signal generator 611 to generate the negative feedback signal 612 corresponding to the output signal 608 and the amplifier control unit 605 further integrating the negative feedback signal 612, the signal processing unit 605B receives the compensated discrete time signal Y[n], and the output of the signal processing unit 605B is:

$$I_p[n] = \sqrt[2]{\frac{Y[n]}{x_{max}}} \times I_{pmax}$$

$$0 < n < \infty;$$

As further illustrated in FIG. 7, the negative feedback controller 703 receives discrete time input signal from the analog to digital converter 701 and compares it to the negative feedback signal 612, and adjust the gain G of the linear digital transformer 702 according to the comparison. For example, if the negative feedback signal 612 corresponding to the output signal 608 shows that the output signal 608 is below a required level, then the negative feedback controller 703 will increase the gain G of the linear digital transformer 702 to increase the output signal 608, wherein said required level is obtained according to the discrete time input signal.

As further illustrated in FIG. 8, the switching amplifier 800 further comprising one slave output unit 811 or more than one slave output units to obtain one or more than one slave output signals 808, wherein each slave output unit 811 comprises: the flyback transformer 801 further comprising a slave secondary winding unit comprising a secondary winding 811A; a switching power transmitting unit 811B coupled to the slave secondary winding unit 811A for blocking a current in the slave secondary winding unit 811A when the current in the primary winding 801A is switched on by the switching unit 802, and conducting the current in the slave secondary winding unit 811A positively or negatively according to the polarity of the input signal 606 when the current in the primary winding 801A is switched off; a slave filter unit 811C to obtain a slave output signal 808 corresponding to the input signal 606 by filtering the output of the switching power transmitting unit 811B and outputting the slave output signal 808.

As further illustrated in FIG. 8, the amplifying gain of the output signal 608 is according to the turn ratio between the primary winding 801A and the secondary winding 801B; and the amplifying gain of the slave output signal 808 is according to the turn ratio between the primary winding 801A and the slave secondary winding 811A. Therefore, it is easy for the switching amplifier 800 to obtain a plurality of output signals with different amplifying gains.

As further illustrated in FIG. 8, the amplifier control unit 605 of the switching amplifier 800 integrates the input signal 606 and the negative feedback signal 612 to process a negative feedback control. Accordingly, with the negative feedback control, the slave output signal 808 trends to track the output signal 608 for the direct current (DC) voltage 803 and load changes. Therefore, the switching amplifier 800 provides multiple output signals are substantially immune to power supply and load perturbations.

As further illustrated in FIG. 8, the switching amplifier 800 further comprises a photo coupler 813 coupled between the negative feedback signal generator 611 and the amplifier control unit 605 to provide electric isolation between the negative feedback signal generator 611 and the amplifier control unit 605.

As further illustrated in FIG. 8, the switching amplifier 800 further comprises isolator circuits 822 coupled between the switching unit 802 and the amplifier control unit 605 to provide electric isolation between the switching unit 802 and the amplifier control unit 605.

As further illustrated in FIG. 8, the switching amplifier 800 further comprises isolator circuits 823, 824 coupled between the switching power transmitting unit 804 and the amplifier control unit 605 to provide electric isolation between the switching power transmitting unit 804 and the amplifier control unit 605.

As further illustrated in FIG. 8, the switching amplifier 800 further comprises isolator circuits 823, 824 coupled between the slave switching power transmitting units 811B corresponding to slave output signals 808 and the amplifier control unit 605 to provide electric isolation between the slave switching power transmitting units 811B and the amplifier control unit 605.

As further illustrated in FIG. 8, the switching amplifier 800 further comprises a rectifying unit 814 and a smoothing unit 815 to rectify and smooth an alternating current (AC) voltage 816 and to provide the direct current (DC) voltage 803.

FIG. 9 is an exemplary block and circuit diagram illustrating a sixth embodiment of a switching amplifier 900 in accordance with the second method of present invention, wherein the inductance means is a flyback transformer 901 comprising a primary winding 901A and a secondary winding unit which comprises two secondary windings 901B and 901C.

As illustrated in FIG. 9, the switching amplifier 900 of the present invention for amplifying an input signal 606 having positive and negative polarities is comprised of: a flyback transformer 901 comprising a primary winding 901A and two secondary windings 901B, 901C; a switching unit 902 coupled to the primary winding 901A for switching a current from a direct current (DC) voltage 903 to the primary winding 901A; a switching power transmitting unit 904 comprising two switches 904A, 904B and two rectifier diode means 904C, 904D, wherein the switching power transmitting unit 904 coupled to the secondary windings 901B, 901C for blocking a current from the secondary windings 901B, 901C to a filter 907 when the current from the direct current (DC) voltage 903 to the primary winding 901A is switched on by the switching unit 902, and conducting the current from the secondary windings 901B, 901C to the filter unit 907 positively or negatively according to the polarity of the input signal 606 when the current from the direct current (DC) voltage 903 to the primary winding 901A is switched off by the switching unit 902; an amplifier control unit 605 for receiving the input signal 606 and coupled to the switching unit 902 and the switching power transmitting unit 904 to control their switching according to the input signal 606; the filter unit 907 to obtain an output signal 608 corresponding to the input signal 606 by filtering the output of the switching power transmitting unit 904 and outputting the output signal 608.

As illustrated in FIG. 9, the switching amplifier 900 further comprises a negative feedback current signal generator 909 which is a resistor to sense a current through the primary winding 901A for generating a negative feedback current signal 910 corresponding to the current of the primary winding 901A, wherein the amplifier control unit 605 integrates the input signal 606 and the negative feedback current signal 910 to process a negative feedback control In this non-limiting exemplary embodiment, the input signal 606 is an analog signal. However, a corresponding embodiment of a switching amplifier in accordance with this invention for an input signal which is a discrete time signal is obvious.

As further illustrated in FIG. 9, the flyback transformer 901 is operated in discontinuous mode. Accordingly, when the current from the direct current (DC) voltage 903 to the primary winding 901A is switched on, the current from the secondary windings 901B, 901C to the filter unit 907 is blocked by the rectifier diode means 904C, 904D of the switching power transmitting unit 904. Therefore, during this switched on period, the current in the primary winding 901A builds up linearly in it from zero to a peak value. Further, when the current from the direct current (DC) voltage 903 to the primary winding 901A is switched off, the current from the secondary windings 901B, 901C to the filter unit 907 is conducted positively or negatively by the switching power transmitting unit 904 for delivering previously stored energy to the filter unit 907.

Therefore, during the period when the current from the direct current (DC) voltage 903 to the primary winding 901A is switched on, the direct current (DC) voltage 903 is applied across the primary winding 901A, and the current in the primary winding 901A builds up linearly from zero to a peak value which is proportional to the switched on period. Therefore, during the switched on period, the energy stored in the primary winding 901A is based on the equation:

$$E = \frac{L_p(I_p)^2}{2}$$

Wherein E is the energy stored, $L_p$ is the inductance of the primary winding 901A, and $I_p$ is the peak value of the current of the primary winding 901A at the end of the switched on period. Therefore, the energy stored into the primary winding 901A during a switched on period is proportional to the square of the peak current of the primary winding 901A.

As further illustrated in FIG. 9, the amplifier control unit 605 comprises: An input unit 605A for receiving the input signal 606 and having an analog to digital converter for converting the input signal 606 to a discrete time input signal x[n]

$$x=\{x[n]\}, 0<n<\infty;$$

wherein the sampling frequency of the discrete time input signal x[n] is according to the switching frequency of the switching units 902 and the switching power transmitting unit 904, therefore, each x[n] is corresponding to instantaneous amplitude of the input signal which corresponding to energy to be delivered at each switching;

A signal processing unit 605B for transforming the discrete time input signal x[n] to a discrete time peak current signal $I_p[n]$ according to the followings:

$$I_p[n] = \sqrt[2]{\frac{x[n]}{x_{max}}} \times I_{pmax}$$

$$0 < n < \infty;$$

wherein $x_{max}$ is the maximum value of the discrete time input signal and $I_{pmax}$ is the maximum value of peak current in the primary winding 901A at the end of the switched on period corresponding to $x_{max}$, wherein the $x_{max}$ and $I_{pmax}$ are all design parameters of the switching amplifier 900. Since the input signal 606 has first and second polarities, therefore, the discrete time peak current signal $I_p[n]$ also has first and second polarities; A switching control unit 605C coupled to the switching unit 902 and the switches 904A, 904B of the switching power transmitting unit 904 to control their switching according to the discrete time peak current signal $I_p[n]$ and the negative feedback current signal 910 corresponding to the current through the primary winding 901A. When the input signal 606 is zero, the switches of the switching unit 902 and the switches 904A, 904B of the switching power transmitting unit 904 are all switched off. When the input signal 606 is not zero, the switch 902 switches the current from the direct current (DC) voltage 903 to the primary winding 901A according to the discrete time peak current signal $I_p[n]$ and the negative feedback current signal 910, for example, at start of each switching, for that the polarity of $I_p[n]$ is positive therefore the switch 904A is switched on and the switch 904B is switched off, the switching control unit 605C switches on the switch 902 and compares the discrete time peak current signal $I_p[n]$ to the negative feedback current signal 910. When the negative feedback current signal 910 reaches $I_p[n]$, the switching control unit 605C switches off the switch 902 and waits for next switching start. For that the polarity of $I_p[n]$ is negative therefore the switch 904A is switched off and the switch 904B is switched on, the switching control unit 605C switches the switches 902 according to the discrete time peak current signal $I_p[n]$ and the negative feedback current signal 910, respectively.

As further illustrated in FIG. 9, the exemplary transforming operated in the signal processing unit 605B according to the equation above is based on that the input signal 605 represents instantaneous energy to be delivered. Therefore the equation of the transforming operated in the signal processing unit 605B mentioned above should be changed or adjusted if the input signal 605 has different definition.

As further illustrated in FIG. 9, the filter unit 907 is a low pass filter to obtain the output signal 608 corresponding to the input signal 606 by filtering the output of the switching power transmitting unit 904 and outputting the output signal 608.

As further illustrated in FIG. 9, the switching amplifier 900 further comprises a negative feedback signal generator 611 to generate a negative feedback signal corresponding to the output signal 612, wherein the amplifier control unit 605 integrates the input signal 606 and the negative feedback signal 612.

FIG. 7 is an exemplary block and circuit diagram illustrating an embodiment of the amplifier control unit 605 integrating the input signal 606 and a negative feedback signal 612 in FIGS. 6, 8 and 9 in accordance with the present invention.

As illustrated in FIG. 7 and FIG. 9, the input unit 605A has an analog to digital converter 701 and further comprises a linear digital transformer 702 and a negative feedback controller 703. Wherein the analog to digital converter 701 receives the input signal 606 and converts the input signal 606 to a discrete time input signal x[n]:

$$x=\{x[n]\}, 0<n<\infty;$$

The linear digital transformer 702 transforms the discrete time input signal x[n] by multiplying a gain G to the discrete time input signal (the default value of the gain G is 1):

$$Y[n]=\{G \times x[n]\}, 0<n<\infty$$

to get a compensated discrete time signal Y[n] and sends the compensated discrete time signal Y[n] to the signal processing unit 605B.

Accordingly, for the switching amplifier 900 which further comprises the negative feedback signal generator 611 to generate the negative feedback signal 612 corresponding to the output signal 608 and the amplifier control unit 605 further integrating the negative feedback signal 612, the signal processing unit 605B receives the compensated discrete time signal Y[n], and the output of the signal processing unit 605B is:

$$I_p[n] = \sqrt[2]{\frac{Y[n]}{x_{max}}} \times I_{pmax}$$

$$0 < n < \infty;$$

As further illustrated in FIG. 7, the negative feedback controller 703 receives discrete time input signal from the analog to digital converter 701 and compares it to the negative feedback signal 612, and adjust the gain G of the linear digital transformer 702 according to the comparison. For example, if the negative feedback signal 612 corresponding to the output signal 608 shows that the output signal 608 is below a required level, then the negative feedback controller 703 will increase the gain G of the linear digital transformer 702 to increase the output signal 608, wherein said required level is obtained according to the discrete time input signal.

As further illustrated in FIG. 9, the switching amplifier 900 further comprising one slave output unit 911 or more than one slave output units to obtain one or more than one slave output signals 908, wherein each slave output unit 911 comprises: the flyback transformer 901 further comprising a slave secondary winding unit comprising two secondary windings 911A, 911B; a switching power transmitting unit 911C coupled to the slave secondary winding unit 911A, 911B for blocking a current in the slave secondary winding unit 911A, 911B when the current in the primary winding 901A is switched on by the switching unit 902, and conducting the current in the slave secondary winding unit 911A, 911B positively or negatively according to the polarity of the input signal 606 when the current in the primary winding 901A is switched off; a slave filter unit 911D to obtain a slave output signal 908 corresponding to the input signal 606 by filtering the output of the switching power transmitting unit 811C and outputting the slave output signal 908.

As further illustrated in FIG. 9, the amplifying gain of the output signal 608 is according to the turn ratio between the primary winding 901A and the secondary windings 901B, 901C; and the amplifying gain of the slave output signal 908 is according to the turn ratio between the primary winding 901A and the slave secondary windings 911A, 911B. Therefore, it is easy for the switching amplifier 900 to obtain a plurality of output signals with different amplifying gains.

As further illustrated in FIG. 9, the amplifier control unit 605 of the switching amplifier 900 integrates the input signal 606 and the negative feedback signal 612 to process a negative feedback control. Accordingly, with the negative feedback control, the slave output signal 908 trends to track the output signal 608 for the direct current (DC) voltage 903 and load changes. Therefore, the switching amplifier 900 provides multiple output signals are substantially immune to power supply and load perturbations.

As further illustrated in FIG. 9, the switching amplifier 900 further comprises a photo coupler 913 coupled between the negative feedback signal generator 611 and the amplifier control unit 605 to provide electric isolation between the negative feedback signal generator 611 and the amplifier control unit 605.

As further illustrated in FIG. 9, the switching amplifier 900 further comprises isolator circuits 922 coupled between the switching unit 902 and the amplifier control unit 605 to provide electric isolation between the switching unit 902 and the amplifier control unit 605.

As further illustrated in FIG. 9, the switching amplifier 900 further comprises isolator circuits 923, 924 coupled between the switching power transmitting unit 904 and the amplifier control unit 605 to provide electric isolation between the switching power transmitting unit 904 and the amplifier control unit 605.

As further illustrated in FIG. 9, the switching amplifier 900 further comprises isolator circuits 923, 924 coupled between the slave switching power transmitting units 911C corresponding to slave output signals 908 and the amplifier control unit 605 to provide electric isolation between the slave switching power transmitting units 911C and the amplifier control unit 605.

As further illustrated in FIG. 9, the switching amplifier 900 further comprises a rectifying unit 914 and a smoothing unit 915 to rectify and smooth an alternating current (AC) voltage 916 and to provide the direct current (DC) voltage 903.

From the switching amplifiers 100, 400, 500, 600, 800 and 900 in accordance with the present invention, one aspect of the present invention provides a switching amplifier that is highly efficient and without the "dead time" problem related to the class D amplifiers. Accordingly, the switches of the switching amplifiers 100, 400, 500, 600, 800 and 900 are never short the direct current (DC) voltage 103 through themselves.

From the switching amplifiers 100, 400, 500, 600, 800 and 900 in accordance with the present invention, another aspect of the present invention provides a switching amplifier that is completely off when there is no input signal.

From the switching amplifiers 400, 500, 800 and 900 in accordance with the present invention, yet another aspect of the present invention provides a switching amplifier for obtaining a plurality of different linearly amplified replicas of the input signal, and adding more outputs easily and economically.

From the switching amplifiers 400, 500, 800 and 900 in accordance with the present invention, yet another aspect of the present invention provides a switching amplifier that isolates the outputs from the power supply.

From the switching amplifiers 100, 400, 500, 600, 800 and 900 in accordance with the present invention, yet another aspect of the present invention provides a switching amplifier which comprised of an act of comparing an input signal with an output feedback signal for detection and correction of overall system signal processes therefore does not require a power supply regulator and is substantially immune to power supply and load perturbations.

From the switching amplifiers 400, 500, 800 and 900 in accordance with the present invention, yet another aspect of the present invention provides a switching amplifier with the negative feedback control that the slave output signals trends to track the output signal for the direct current (DC) voltage and load changes for obtaining multiple output signals are substantially immune to power supply and load perturbations.

It is to be understood that the above described embodiments are merely illustrative of the principles of the invention and that other arrangements may be devised by those skilled in the art without departing from the spirit and scope of the invention.

What is claimed is:

1. A method of obtaining an output signal from a direct current (DC) voltage, wherein the output signal is a linearly amplified replica of an input signal having first and second polarities, comprising the steps of:
   receiving the input signal;
   transforming and pulse modulating the input signal for generating a pulse modulated signal, wherein said transforming is based on that when applying the direct current (DC) voltage across an inductance means, the energy stored in the inductance means is proportional to square of time of said applying;
   switching a current from the direct current (DC) voltage to the inductance means according to the pulse modulated signal;
   blocking a current from the inductance means to a filter when the current from the direct current (DC) voltage to the inductance means is switched on and conducting the current from the inductance means to the filter positively or negatively according to the polarity of the input signal when the current from the direct current (DC) voltage to the inductance means is switched off;
   filtering said current from the inductance means for outputting the output signal by the filter.

2. The method of claim 1, wherein the inductance means comprises an inductor or a flyback transformer.

3. The method of claim 2, wherein the flyback transformer comprises a primary winding and a secondary winding unit, wherein the secondary winding unit comprises a secondary winding or two secondary windings.

4. The method of claim 3 further comprising:
getting at least one slave output signals comprising the following steps for each slave output signal from its corresponding slave secondary winding unit of the flyback transformer, wherein the flyback transformer further comprises at least one slave secondary winding units that each slave secondary winding unit comprising a secondary winding or two secondary windings is for generating a corresponding slave output signal:
blocking a current in the corresponding secondary winding unit when the current in the primary winding is switched on;
conducting a current from the corresponding slave secondary winding units to a filter positively or negatively according to the polarity of the pulse modulated signal when the current in the primary winding is switched off;
filtering the current from the corresponding slave secondary winding unit for outputting the slave output signal by the filter.

5. The method of claim 1 further comprising:
getting a feedback signal by detecting the output signal and integrating the feedback signal to process a negative feedback control.

6. A method of obtaining an output signal from a direct current (DC) voltage, wherein the output signal is a linearly amplified replica of an input signal having first and second polarities, comprising the steps of:
receiving the input signal;
transforming the input signal for generating a discrete time peak current signal, wherein said transforming is according to that when applying the direct current (DC) voltage across an inductance means, the energy stored in the inductance means is proportional to square of the peak current of the inductance means;
switching a current from the direct current (DC) voltage to the inductance means and getting a feedback current signal by detecting the current of the inductance means, wherein said switching is according to the discrete time peak current signal and the feedback current signal;
blocking a current from the inductance means to a filter when the current from the direct current (DC) voltage to the inductance means is switched on, and conducting the current from the inductance means to the filter positively or negatively according to the polarity of the input signal when the current from the direct current (DC) voltage to the inductance means is switched off;
filtering said current from the inductance means for outputting the output signal by the filter.

7. The method of claim 6, wherein the inductance means comprises an inductor or a flyback transformer.

8. The method of claim 7, wherein the flyback transformer comprises a primary winding and a secondary winding unit, wherein the secondary winding unit comprises a secondary winding or two secondary windings.

9. The method of claim 8 further comprising:
getting at least one slave output signals comprising the following steps for each slave output signal from its corresponding slave secondary winding units of the flyback transformer, wherein the flyback transformer further comprises at least one slave secondary winding units that each slave secondary winding unit comprising a secondary winding or two secondary windings is for generating a corresponding slave output signal:
blocking a current in the corresponding slave secondary winding units when the current in the primary winding is switched on:
conducting a current from the corresponding slave secondary winding unit to a filter positively or negatively according to the polarity of the pulse modulated signal when the current in the primary winding is switched off;
filtering the current from the corresponding slave secondary winding unit for outputting the slave output signal by the filter.

10. The method of claim 6 further comprising:
getting a feedback signal by detecting the output signal and integrating the feedback signal to process a negative feedback control.

11. A switching amplifier for obtaining an output signal from a direct current (DC) voltage, wherein the output signal is a linearly amplified replica of an input signal having first and second polarities, said amplifier comprising:
an inductance means;
a switching unit comprising at least one switch and coupled to the inductance means for switching a current from the direct current (DC) voltage to the inductance means;
a switching power transmitting unit comprising a plurality of switches and coupled to the inductance means for blocking a current from the inductance means to a filter when the current from the direct current (DC) voltage to the inductance means is switched on by the switching unit, and conducting the current from the inductance means to the filter unit positively or negatively according to the polarity of the input signal when the current from the direct current (DC) voltage to the inductance means is switched off by the switching unit;
an amplifier control unit receiving the input signal and coupled to the switching unit and the switching power transmitting unit to control their switching according to the input signal;
said filter unit to obtain an output signal corresponding to the input signal by filtering the current from the inductance means for outputting the output signal by the filter.

12. The switching amplifier according to claim 11, wherein the inductance means comprises an inductor or a flyback transformer.

13. The switching amplifier according to claim 12, wherein the flyback transformer comprises a primary winding coupled to the switching unit and a secondary winding unit comprising a secondary winding or two secondary windings and coupled to the switching power transmitting unit.

14. The switching amplifier according to claim 13, further comprising one or more than one slave output units to obtain one or more than one slave output signals, wherein each slave output unit comprises:
the flyback transformer further comprising a slave secondary winding unit comprising a secondary winding or two secondary windings;
a switching power transmitting unit coupled to the slave secondary winding unit for blocking a current in the slave secondary winding unit when the current in the primary winding is switched on by the switching unit, and conducting a current from the slave secondary winding unit positively or negatively to a slave filter unit according to the polarity of the input signal when the current in the primary winding is switched off;
the slave filter unit to obtain a slave output signal corresponding to the input signal by filtering the current from the slave secondary winding unit for outputting the slave output signal.

15. The switching amplifier according to claim 11, further comprising:
a negative feedback current signal generator to generate a negative feedback current signal corresponding to the current of the inductance means, wherein the amplifier control unit integrates the input signal and the negative feedback current signal to process a negative feedback control.

16. The switching amplifier according to claim 11, further comprising:
a negative feedback signal generator to generate a negative feedback signal corresponding to the output signal, wherein the amplifier control unit integrates the input signal and the negative feedback signal to process a negative feedback control.

17. The switching amplifier according to claim 11, further comprising:
a rectifying and smoothing unit to rectify and smooth an alternating current (AC) voltage and to provide the direct current (DC) voltage.

18. The switching amplifier according to claim 11, further comprising one or more than one isolator circuits for:
isolator circuit coupled between the negative feedback current signal generator and the amplifier control unit to provide electric isolation between the negative feedback current signal generator and the amplifier control unit;
isolator circuit coupled between the negative feedback signal generator and the amplifier control unit to provide electric isolation between the negative feedback signal generator and the amplifier control unit;
isolator circuit coupled between the switching unit and the amplifier control unit to provide electric isolation between the switching unit and the amplifier control unit;
isolator circuit coupled between the switching power transmitting unit and the amplifier control unit to provide electric isolation between the switching power transmitting unit and the amplifier control unit;
isolator circuit coupled between the switching power transmitting units of the slave output units and the amplifier control unit to provide electric isolation between the switching power transmitting units of the slave output units and the amplifier control unit.

19. The switching amplifier according to claim 11, wherein the input signal is an analog signal or a discrete time signal.

20. The switching amplifier according to claim 11, wherein the filter unit or the slave filter unit is a low pass filter or a band pass filter or a band stop filter.

* * * * *